(12) United States Patent
Agata et al.

(10) Patent No.: US 12,261,058 B2
(45) Date of Patent: Mar. 25, 2025

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventors: Yasunori Agata, Matsumoto (JP); Takashi Yoshimura, Matsumoto (JP); Hiroshi Takishita, Matsumoto (JP); Misaki Uchida, Matsumoto (JP); Michio Nemoto, Matsumoto (JP); Toru Ajiki, Matsumoto (JP); Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 599 days.

(21) Appl. No.: 17/486,977

(22) Filed: Sep. 28, 2021

(65) Prior Publication Data

US 2022/0013368 A1    Jan. 13, 2022

Related U.S. Application Data

(63) Continuation of application No. PCT/JP2020/034982, filed on Sep. 15, 2020.

(30) Foreign Application Priority Data

Oct. 11, 2019    (JP) ................................. 2019-187797

(51) Int. Cl.
*H01L 21/322* (2006.01)
*H01L 27/06* (2006.01)
(Continued)

(52) U.S. Cl.
CPC ...... *H01L 21/3223* (2013.01); *H01L 27/0664* (2013.01); *H01L 29/063* (2013.01); (Continued)

(58) Field of Classification Search
CPC ............ H01L 21/3223; H01L 29/7397; H01L 29/8613; H01L 29/063; H01L 29/1095; H01L 29/32; H01L 27/0664
See application file for complete search history.

(56) References Cited

U.S. PATENT DOCUMENTS 6,703,292 B1   3/2004 Grover
2006/0286753 A1  12/2006 Barthelmess
(Continued)

FOREIGN PATENT DOCUMENTS

JP    2007266233 A  * 10/2007
JP    2012023327 A    2/2012
(Continued)

OTHER PUBLICATIONS

Translations of the Specification (description) and Drawings of JP-2007266233-A (Sugiyama, et al.) are attached (full reference listed under Foreign Patent Documents) (2007).*

(Continued)

*Primary Examiner* — William C Trapanese

(57) ABSTRACT

Provided is a semiconductor device, including a semiconductor substrate having an upper surface and a lower surface and including a bulk donor, wherein a hydrogen chemical concentration distribution of the semiconductor substrate in a depth direction is flat, monotonically increasing, or monotonically decreasing from the lower surface to the upper surface except for a portion where a local hydrogen concentration peak is provided; and a donor concentration of the semiconductor substrate is higher than a bulk donor concentration over an entire region from the upper surface to the lower surface. Hydrogen ions may be irradiated from the upper surface or the lower surface of the semiconductor substrate so as to penetrate the semiconductor substrate in the depth direction.

21 Claims, 30 Drawing Sheets

(51) Int. Cl.
  *H01L 29/06*  (2006.01)
  *H01L 29/10*  (2006.01)
  *H01L 29/32*  (2006.01)
  *H01L 29/40*  (2006.01)
  *H01L 29/739*  (2006.01)
  *H01L 29/861*  (2006.01)

(52) U.S. Cl.
  CPC .......... *H01L 29/1095* (2013.01); *H01L 29/32* (2013.01); *H01L 29/407* (2013.01); *H01L 29/7397* (2013.01); *H01L 29/8613* (2013.01)

(56) References Cited

U.S. PATENT DOCUMENTS

| | | | |
|---|---|---|---|
| 2011/0027957 A1* | 2/2011 | Berry | H01L 21/228 257/E21.135 |
| 2012/0267681 A1 | 10/2012 | Nemoto | |
| 2013/0249058 A1 | 9/2013 | Neidhart | |
| 2014/0246750 A1* | 9/2014 | Takishita | H01L 29/1095 257/493 |
| 2014/0246755 A1 | 9/2014 | Yoshimura | |
| 2014/0357026 A1* | 12/2014 | Kobayashi | H01L 29/1095 438/530 |
| 2015/0050754 A1 | 2/2015 | Ploss | |
| 2015/0050798 A1* | 2/2015 | Kobayashi | H01L 21/263 438/475 |
| 2015/0179441 A1 | 6/2015 | Onozawa | |
| 2015/0214347 A1 | 7/2015 | Falck | |
| 2015/0270132 A1 | 9/2015 | Laven | |
| 2015/0357229 A1 | 12/2015 | Schulze | |
| 2015/0371858 A1 | 12/2015 | Laven | |
| 2016/0141399 A1 | 5/2016 | Jelinek | |
| 2016/0172438 A1 | 6/2016 | Jelinek | |
| 2017/0271447 A1 | 9/2017 | Tamura | |
| 2018/0005829 A1* | 1/2018 | Takishita | H01L 21/8222 |
| 2018/0005831 A1 | 1/2018 | Schulze | |
| 2018/0122895 A1 | 5/2018 | Jelinek | |
| 2018/0350962 A1 | 12/2018 | Naito | |
| 2021/0082702 A1 | 3/2021 | Agata | |
| 2021/0104407 A1 | 4/2021 | Meguro | |

FOREIGN PATENT DOCUMENTS

| | | |
|---|---|---|
| JP | 2015037194 A | 2/2015 |
| WO | 0106557 A1 | 1/2001 |
| WO | 2011052787 A1 | 5/2011 |
| WO | 2013100155 A1 | 7/2013 |
| WO | 2016157935 A1 | 10/2016 |
| WO | 2016204227 A1 | 12/2016 |
| WO | 2018030444 A1 | 2/2018 |
| WO | 2020080295 A1 | 4/2020 |
| WO | 2020138218 A1 | 7/2020 |

OTHER PUBLICATIONS

Office Action issued for counterpart Chinese Application 202080024662.6, issued by The State Intellectual Property Office of People's Republic of China on Dec. 28, 2023.

International Search Report and (ISA/237) Written Opinion of the International Search Authority for International Patent Application No. PCT/JP2020/034982, mailed by the Japan Patent Office on Dec. 1, 2020.

* cited by examiner

SEMICONDUCTOR DEVICE AND MANUFACTURING METHOD OF SEMICONDUCTOR DEVICE

The contents of the following Japanese patent applications are incorporated herein by reference:
NO. 2019-187797 filed in JP on Oct. 11, 2019, and
PCT/JP2020/034982 filed in WO on Sep. 15, 2020.

BACKGROUND

1. Technical Field

The present invention relates to a semiconductor device and a manufacturing method.

2. Related Art

Conventionally, there is known a technique in which hydrogen is implanted into a predetermined depth of a semiconductor substrate and diffused, so that lattice defects formed in the implanted region are attached to hydrogen to form a donor, and a doping concentration can be increased (see, for example, Patent Documents 1 to 3).

Patent Document 1: WO 2016/204227
Patent Document 2: Japanese Patent Application Publication No. 2007-266233
Patent Document 3: Japanese Patent Application Publication No. 2015-37194

3. Problems to be Solved

The doping concentration is increased by hydrogen donors over a wide range of the semiconductor substrate.

GENERAL DISCLOSURE

In order to solve the above problem, a first aspect of the present invention provides a semiconductor device provided with a semiconductor substrate which has an upper surface and a lower surface, and contains a bulk donor. A hydrogen chemical concentration distribution of the semiconductor substrate in a depth direction may be flat, monotonically increasing, or monotonically decreasing from the lower surface to the upper surface except for a portion where a local hydrogen concentration peak is provided. The donor concentration of the semiconductor substrate may be higher than the bulk donor concentration throughout from the upper surface to the lower surface.

The semiconductor substrate may include a termination dangling bond that is a dangling bond terminated with hydrogen. The semiconductor substrate may be provided with a termination dangling bond flat region in which the concentration of the termination dangling bond is flat, monotonically increases, or monotonically decreases over a range of 40% or more of the thickness of the semiconductor substrate in the depth direction.

The termination dangling bond flat region may be in a range of 60% or less of the thickness of the semiconductor substrate in the depth direction.

The termination dangling bond flat region may include a central position of the semiconductor substrate in the depth direction.

The hydrogen chemical concentration may monotonically decrease from a peak closest to the top surface to the upper surface.

The hydrogen chemical concentration in the upper surface may be higher than the bulk donor concentration.

The semiconductor device may include a donor concentration flat region in which the donor concentration is flat, monotonically increases, or monotonically decreases between the peak of the hydrogen chemical concentration closest to the upper surface and the upper surface. The absolute value of the semi-logarithmic slope of the donor concentration flat region may be from 0/cm to 50/cm.

The semiconductor substrate may have a drift region of a first conductivity type, a base region of a second conductivity type provided between the drift region and the upper surface, and a collector region of the second conductivity type provided between the drift region and the lower surface. At least a part of the drift region may be the dangling bond flat region.

The hydrogen chemical concentration may have a monotonically decreasing section in which the concentration monotonically decreases between the peak closest to the upper surface and the base region. The hydrogen chemical concentration may have an increasing section in which the concentration increases between the base region and the upper surface.

The semiconductor substrate may have an accumulation region of the first conductivity type having a doping concentration higher than that of the drift region between the drift region and the base region.

The semiconductor substrate may have a buffer region of the first conductivity type having a doping concentration higher than that of the drift region between the drift region and the collector region.

When the rated voltage of the semiconductor device is x (V), the bulk donor concentration (atoms/cm$^3$) may be from $(9.20245\times10^{12})/x$ to $(4.60123\times10^{16})/x$.

The bulk donor concentration (atoms/cm$^3$) may be from $(9.20245\times10^{14})/x$ to $(1.84049\times10^{16})/x$.

The donor concentration (/cm$^3$) at the center of the semiconductor device in the depth direction may be from $(9.20245\times10^{15})/x$ to $(9.20245\times10^{16})/x$.

In a region where the hydrogen chemical concentration distribution of the semiconductor substrate in the depth direction is flat, monotonically increases, or monotonically decreases, a ratio $N_B/N_F$ of the bulk donor concentration $N_B$ to the donor concentration $N_F$ may be 0.5 or less. The ratio $N_B/N_F$ may be 0.1 or less.

In a region where the hydrogen chemical concentration distribution of the semiconductor substrate in a depth direction is flat, monotonically increases, or monotonically decreases, a ratio $\beta$ of an actual bulk donor concentration $N_{Bre}$ to a specification value $N_{B0}$ of a bulk donor concentration may be set as $\beta=N_{Bre}/N_{B0}$, and a ratio $\gamma$ of an actual donor concentration $N_{Fre}$ to a target value $N_{F0}$ of a final donor concentration is set as $\gamma=N_{Fre}/N_{F0}$, and an allowable ratio of a variation of $\gamma$ may be set as $\gamma_0$, satisfying: $\varepsilon'=N_{B0}/N_{F0}$, and $-\gamma_0/\varepsilon'+1\leq\beta\leq\gamma_0/\varepsilon'+1$.

An allowable ratio $\gamma_0$ may be $\pm0.15$.

A second aspect of the present invention provides a manufacturing method of a semiconductor device including a semiconductor substrate having an upper surface and a lower surface. The manufacturing method may include a hydrogen irradiation step of irradiating hydrogen ions from the upper surface or the lower surface of the semiconductor substrate so as to penetrate the semiconductor substrate in the depth direction. The manufacturing method may include a heat treatment step of heat-treating the semiconductor substrate.

In the hydrogen irradiation step, the semiconductor substrate may be irradiated with hydrogen ions with acceleration energy that is twice or more the acceleration energy corresponding to the thickness of the semiconductor substrate.

Note that the above summary of the invention does not enumerate all the necessary features of the present invention. Further, a sub-combination of these feature groups can also be an invention.

DESCRIPTION OF EXEMPLARY EMBODIMENTS

Figure 1A:
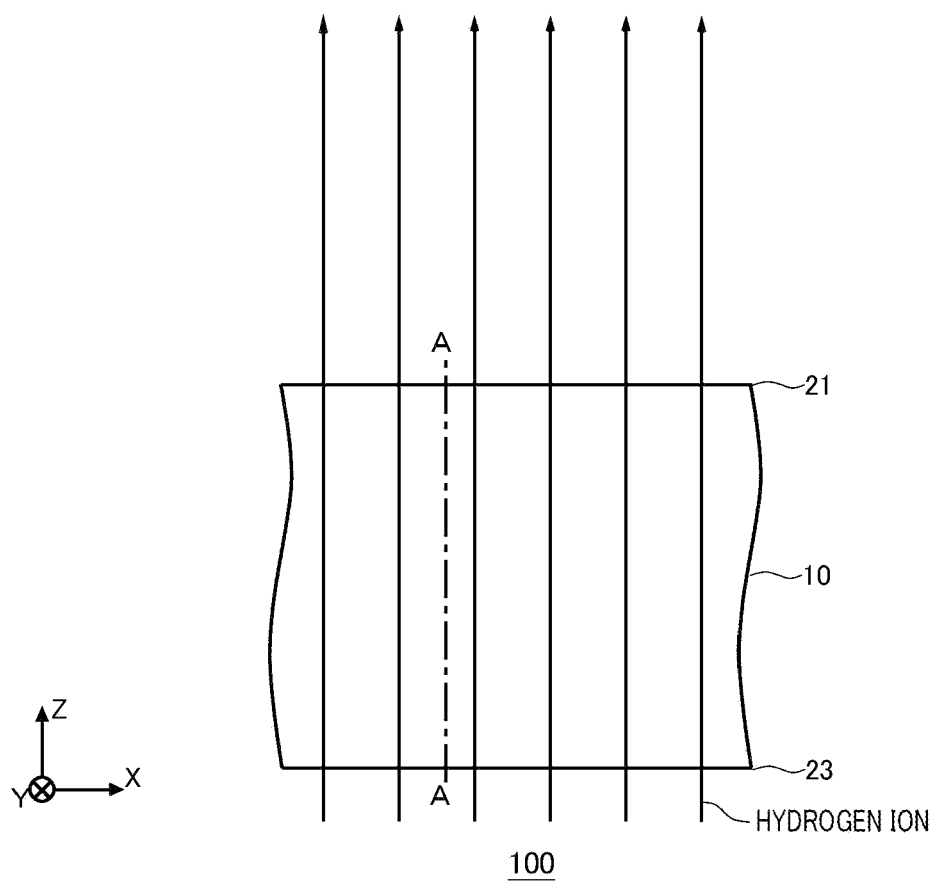
FIG. 1A is a cross-sectional view illustrating an example of a semiconductor device 100.

Hereinafter, the present invention will be described through embodiments of the invention, but the following embodiments do not limit the invention according to the claims. In addition, not all combinations of features described in the embodiments are essential to the solution of the invention.

In the present specification, one side in a direction parallel to the depth direction of the semiconductor substrate is referred to as "upper", and the other side is referred to as "lower". One of two main surfaces of a substrate, a layer, or another member is referred to as an upper surface, and the other surface is referred to as a lower surface. The "upper" and "lower" directions are not limited to the gravity direction or the direction at the time of mounting the semiconductor device.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not limit the height direction with respect to the ground. The +Z axis direction and the −Z axis direction are opposite to each other. When the positive and negative are not described and described as the Z axis direction, it means a direction parallel to the +Z axis and the −Z axis.

In the present specification, orthogonal axes parallel to the upper surface and the lower surface of the semiconductor substrate are defined as an X axis and a Y axis. An axis perpendicular to the upper surface and the lower surface of the semiconductor substrate is defined as a Z axis. In the present specification, the Z axis direction may be referred to as a depth direction. In addition, in the present specification, a direction parallel to the upper surface and the lower surface of the semiconductor substrate including the X axis and the Y axis may be referred to as a horizontal direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, the term "same" or "equal" may include a case where there is an error due to manufacturing variation or the like. The error is, for example, within 10%.

In the present specification, the conductivity type of a doping region doped with impurities is described as a P type or an N type. In the present specification, the impurity may particularly mean either a donor of an N type or an acceptor of a P type, and may be described as a dopant. In the present specification, doping means introducing a donor or an acceptor into a semiconductor substrate to form a semiconductor exhibiting a conductivity type of an N type or a semiconductor exhibiting a conductivity type of a P type.

In the present specification, the doping concentration means the concentration of the donor or the concentration of the acceptor in the thermal equilibrium state. In the present specification, the net doping concentration means the net concentration obtained by adding the donor concentration as the concentration of positive ions and the acceptor concentration as the concentration of negative ions including the polarity of charges. As an example, when the donor concentration is $N_D$ and the acceptor concentration is $N_A$, the net doping concentration at an arbitrary position is $N_D-N_A$. In the present specification, the net doping concentration may be simply referred to as a doping concentration.

The donor has a function of supplying electrons to the semiconductor. The acceptor has a function of receiving electrons from the semiconductor. The donor and acceptor are not limited to the impurities themselves. For example, a VOH defect in which vacancies (V), oxygen (O), and hydrogen (H) are attached in a semiconductor works as a donor for supplying electrons. The VOH defect may be referred to herein as a hydrogen donor.

In the present specification, when described as a P+ type or an N+ type, it means that the doping concentration is higher than that of a P type or an N type, and when described as a P− type or an N− type, it means that the doping concentration is lower than that of the P type or the N type. In addition, in the present specification, the description of the P++ type or the N++ type means that the doping concentration is higher than that of the P+ type or the N+ type. The unit system in this specification is an SI unit system unless otherwise specified. The unit of length may be expressed in cm, but various calculations may be performed after conversion into meters (m).

In the present specification, the chemical concentration refers to the atomic density of impurities measured regardless of the state of electrical activation. The chemical concentration can be measured by, for example, secondary ion mass spectrometry (SIMS). The above-described net doping concentration can be measured by a voltage-capacitance measurement method (CV method). In addition, the carrier concentration measured by a spread resistance measurement method (SR method) may be a net doping concentration. The carrier concentration measured by the CV method or the SR method may be a value in a thermal equilibrium state. In addition, since the donor concentration is sufficiently larger than the acceptor concentration in a region of the N type, the carrier concentration in the region may be used as the donor concentration. Similarly, in a region of the P type, the carrier concentration in the region may be set as the acceptor concentration. In the present specification, the doping concentration of the region of the N type may be referred to as a donor concentration, and the doping concentration of the region of the P type may be referred to as an acceptor concentration.

In addition, when the concentration distribution of the donor, acceptor, or net doping has a peak, the peak value may be the concentration of the donor, acceptor, or net doping in the region. In a case where the concentration of the donor, the acceptor, or the net doping is substantially uniform or the like, an average value of the concentration of the donor, the acceptor, or the net doping in the corresponding region may be used as the concentration of the donor, the acceptor, or the net doping. In the present specification, atoms/cm$^3$ or/cm$^3$ is used for concentration display per unit volume. This unit is used for the donor or acceptor concentration or the chemical concentration in the semiconductor substrate. The expression of atoms may be omitted.

The carrier concentration measured by the SR method may be lower than the concentration of the donor or the acceptor. In a range where the current flows when measuring a spreading resistance, there is a case where the carrier mobility of the semiconductor substrate is lower than the value of the crystal state. The decrease in carrier mobility occurs by disorder of the crystal structure caused by a lattice defect or the like to make the carrier scatter.

The concentration of the donor or the acceptor calculated from the carrier concentration measured by the CV method or the SR method may be lower than the chemical concentration of the element indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen.

FIG. 1A is a cross-sectional view illustrating an example of a semiconductor device 100. The semiconductor device 100 includes a semiconductor substrate 10. The semiconductor substrate 10 is a substrate formed of a semiconductor material. As an example, the semiconductor substrate 10 is a silicon substrate.

At least one of a transistor device such as an insulated gate bipolar transistor (IGBT) and a diode device such as a freewheeling diode (FWD) is formed on the semiconductor substrate 10. In FIG. 1A, the respective electrodes of the transistor device and the diode device, and the respective regions provided in the semiconductor substrate 10 are omitted. Configuration examples of the transistor device and the diode device will be described later.

In the semiconductor substrate 10 of this example, bulk donors of the N type are distributed throughout. The bulk donor is a dopant donor substantially uniformly contained in an ingot during the production of the ingot from which the semiconductor substrate 10 is based. The bulk donor of this example is an element other than hydrogen. The dopant of the bulk donor is, for example, phosphorus, antimony, arsenic, selenium, or sulfur, but the invention is not limited to these. The bulk donor of this example is phosphorus. The bulk donor is also contained in the region of the P type. The semiconductor substrate 10 may be a wafer cut out of a semiconductor ingot, or may be a chip obtained by cutting a wafer into individual pieces. The semiconductor ingot may be manufactured by either a Czochralski method (CZ method), a magnetic field applied Czochralski method (MCZ method), or a float zone method (FZ method). The ingot in this example is manufactured by the MCZ method. The substrate manufactured by the MCZ method has an oxygen concentration of $1 \times 10^{17}$ to $7 \times 10^{17}/cm^3$. The oxygen concentration contained in the substrate manufactured by the FZ method is $1 \times 10^{15}$ to $5 \times 10^{16}/cm^3$. When the oxygen concentration is high, hydrogen donors tend to be easily generated. As the bulk donor concentration, the chemical concentration of the bulk donor distributed throughout the semiconductor substrate 10 may be used, or a value between 90% to 100% of the chemical concentration may be used. As the semiconductor substrate 10, a non-doped substrate not containing a dopant such as phosphorus may be used. In that case, the bulk donor concentration (D0) of the non-doped substrate is, for example, from $1 \times 10^{10}/cm^3$ to $5 \times 10^{12}/cm^3$. The bulk donor concentration (D0) of the non-doped substrate is preferably $1 \times 10^{11}/cm^3$ or more. The bulk donor concentration (D0) of the non-doped substrate is preferably $5 \times 10^{12}/cm^3$ or less. Each concentration in the present invention may be a value at room temperature. As the value at room temperature, a value at 300 K (Kelvin) (about 26.9° C.) may be used as an example.

The semiconductor substrate 10 has an upper surface 21 and a lower surface 23. The upper surface 21 and the lower surface 23 are two main surfaces of the semiconductor substrate 10. In the present specification, an orthogonal axis in a plane parallel to the upper surface 21 and the lower surface 23 is defined as an X axis and a Y axis, and an axis perpendicular to the upper surface 21 and the lower surface 23 is defined as a Z axis.

Hydrogen ions (for example, protons) are implanted into the semiconductor substrate 10 from the lower surface 23 so as to penetrate the semiconductor substrate 10. The average distance (also referred to as a range) over which hydrogen ions pass through the inside of the semiconductor substrate 10 can be controlled by acceleration energy for accelerating hydrogen ions. In this example, the acceleration energy is set such that the range of hydrogen ions is larger than the thickness of the semiconductor substrate 10. Hydrogen ions may be accelerated with acceleration energy that is twice or more the acceleration energy corresponding to the thickness of the semiconductor substrate 10.

In the semiconductor substrate 10, some hydrogen ions remain in a region through which hydrogen ions have passed. Therefore, by implanting hydrogen ions so as to penetrate the semiconductor substrate 10, hydrogen can be distributed over the entire semiconductor substrate 10.

In the present specification, a region through which the implanted hydrogen ions have passed may be referred to as a pass-through region. In the example of FIG. 1A, the entire semiconductor substrate 10 is the pass-through region. In another example, hydrogen ions may penetrate only a partial region of the semiconductor substrate 10 in the XY plane. As a result, hydrogen ions can be locally implanted.

In the pass-through region through which the hydrogen ions have passed in the semiconductor substrate 10, lattice defects mainly including vacancies such as monatomic vacancies (V) and divacancies (VV) are formed by the passage of hydrogen. Atoms adjacent to the vacancies have dangling bonds. The lattice defect also includes inter-lattice atoms, dislocates, or the like, and in a broader way donors and acceptors can also be included. However, in the present specification, the lattice defect mainly composed of vacancies may be called a lattice defect of a vacancy type, a vacancy defect, or simply a lattice defect. In the present specification, the concentration of lattice defects mainly including vacancies may be referred to as a vacancy concentration. In addition, since a large number of lattice defects are formed due to the implantation of hydrogen ions into the semiconductor substrate 10, the crystallinity of the semiconductor substrate 10 may be strongly disturbed. In the present specification, the crystallinity disturbance may be called a disorder.

In addition, oxygen is contained in the entire semiconductor substrate 10. The oxygen is introduced intentionally or unintentionally at the time of manufacturing a semiconductor ingot. In the semiconductor substrate 10, hydrogen (H), a vacancy (V), and oxygen (O) are attached to form a VOH defect. In addition, the heat treatment of the semiconductor substrate 10 diffuses hydrogen to promote the formation of VOH defects. The VOH defect works as a donor that supplies electrons. In the present specification, the VOH defect may be simply called as a hydrogen donor.

In the semiconductor substrate 10 of this example, hydrogen donors are formed in the pass-through region of hydrogen ions. The hydrogen donor in the pass-through region is formed by terminating hydrogen at a dangling bond of a lattice defect of a vacancy type formed in the pass-through region and further bonding to oxygen. Therefore, the doping concentration distribution of the hydrogen donor in the pass-through region may follow a vacancy concentration distribution. The hydrogen chemical concentration in the pass-through region may be 10 times or more, or 100 times or more of the vacancy concentration formed in the pass-through region. The hydrogen in the pass-through region may be hydrogen remaining after the passage of hydrogen ions, or may be hydrogen diffused from a hydrogen supply source described later. The doping concentration of the hydrogen donor is lower than the chemical concentration of hydrogen. When the ratio of the doping concentration of the hydrogen donor to the chemical concentration of hydrogen is defined as an activation rate, the activation rate may be a value of 0.1% to 30%. In this example, the activation rate is 1% to 5%.

By forming a hydrogen donor in the pass-through region of the semiconductor substrate 10, the donor concentration in the pass-through region can be made higher than the bulk donor concentration. Usually, it is necessary to prepare the semiconductor substrate 10 having a predetermined bulk donor concentration in accordance with characteristics of an element to be formed in the semiconductor substrate 10, particularly a rated voltage or a withstand voltage. On the other hand, according to the semiconductor device 100 illustrated in FIG. 1A, the donor concentration of the semiconductor substrate 10 can be adjusted by controlling the dosage of hydrogen ions. Therefore, the semiconductor device 100 can be manufactured using a semiconductor substrate having a bulk donor concentration that does not correspond to the characteristics and the like of the element. The variation in the bulk donor concentration at the time of manufacturing the semiconductor substrate 10 is relatively large, but the dosage of hydrogen ions can be controlled with relatively high accuracy. Therefore, the concentration of lattice defects generated by implanting hydrogen ions can also be controlled with high accuracy, and the donor concentration of the pass-through region can be controlled with high accuracy.

Figure 1B:
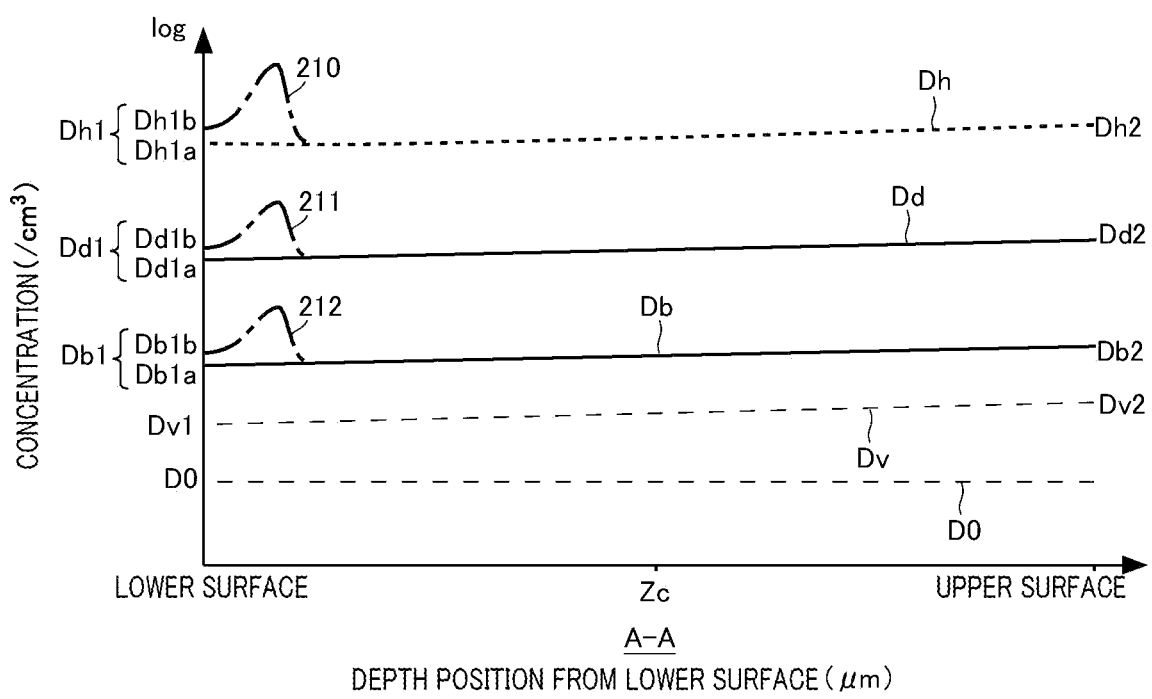
FIG. 1B illustrates a hydrogen chemical concentration distribution, a donor concentration distribution, and a concentration distribution of a termination dangling bond terminated with hydrogen in a depth direction at a position indicated by line A-A in FIG. 1A

FIG. 1B illustrates an example of a distribution of hydrogen chemical concentration Dh, a distribution of donor concentration Dd, and a distribution of concentration Db of a termination dangling bond terminated with hydrogen in the depth direction at a position indicated by line A-A in FIG. 1A. In FIG. 1B, the horizontal axis represents the depth position from the lower surface 23, and the vertical axis represents the concentration per unit volume on a logarithmic axis. The donor concentration in FIG. 1B is measured by, for example, the CV method or the SR method. The hydrogen chemical concentration in FIG. 1B is, for example, a hydrogen concentration measured by the SIMS method. The concentration of termination dangling bonds is the concentration of VOH defects described above and is the concentration of hydrogen donors. The termination dangling bond concentration may be a concentration obtained by subtracting the concentration of donors other than hydrogen from the donor concentration measured by the SR method or the like. The concentration of donors other than hydrogen is, for example, the concentration of impurities of the N type such as phosphorus. As an example, the concentration of donors is a concentration obtained by subtracting a bulk donor concentration D0 from the donor concentration measured by the SR method or the like. In FIG. 1B, the hydrogen chemical concentration Dh is indicated by a broken line, and the donor concentration Dd and the termination dangling bond Db are indicated by a solid line. In FIG. 1B, the bulk donor concentration is D0. Further, the center position of the semiconductor substrate 10 in the depth direction is defined as Zc. In addition, the hydrogen chemical concentration in the lower surface 23 of the semiconductor substrate 10 is denoted by Dh1, the donor concentration is denoted by Dd1, the termination dangling bond concentration is denoted by Db1, the hydrogen chemical concentration in the upper surface 21 is denoted by Dh2, the donor concentration is denoted by Dd2, and the termination dangling bond concentration is denoted by Db2. The bulk donor concentration is D0 for both the lower surface 23 and the upper surface 21.

The distribution of the hydrogen chemical concentration Dh may be flat, monotonically increasing, or monotonically decreasing from the lower surface 23 to the upper surface 21 of the semiconductor substrate 10, except for a portion where a local hydrogen concentration peak is provided. In this example, the distribution of the hydrogen chemical concentration increases monotonically. A local hydrogen concentration peak 210 is, for example, a hydrogen concentration peak formed by implanting hydrogen ions in a range smaller than half the thickness of the semiconductor substrate 10.

In FIG. 1B, as an additional example, a local peak in the hydrogen concentration or the like is indicated by a dashed line. The local hydrogen concentration peak 210 is, for example, a hydrogen concentration peak 210 formed by implanting hydrogen ions from the lower surface 23 of the semiconductor substrate 10 to a region on the lower surface 23 side of the semiconductor substrate 10. In the hydrogen concentration peak 210 due to hydrogen ions having a small range, the half-value width of the distribution becomes relatively small. The half-value width of the local peak in each concentration distribution may be $1/10$ or less or $1/20$ or less of the thickness of the semiconductor substrate 10. A plurality of hydrogen concentration peaks 210 may be present in the semiconductor substrate 10. When the hydrogen concentration peak 210 is in the vicinity of the lower surface 23 and has a high hydrogen concentration, it may be a hydrogen supply source. If the local hydrogen concentration peak 210 is present, the donor concentration Dd may also have a local peak 211 at the same depth position and the termination dangling bond Db may also have a local peak 212.

When hydrogen ions are implanted, damage is introduced into a region from the implantation surface of the semiconductor substrate 10 to a range portion of the hydrogen ions. The damage refers to disturbance of a crystal lattice, and may be in an amorphous state in addition to vacancies and dislocations. FIG. 1B illustrates an example of the distribution of the vacancy concentration Dv after hydrogen ions are implanted through the semiconductor substrate 10. In the vacancy concentration Dv in FIG. 1B, the vacancy concentration peak corresponding to the local hydrogen concentration peak 210 is omitted. Here, the term "after the implantation of hydrogen ions" means from the implantation of hydrogen ions to before the first heat treatment at a temperature higher than room temperature. In a region deeper than the implantation surface (the lower surface 23 in this example) of hydrogen ions, the concentration of vacancies may be flat, monotonically increasing, or monotonically decreasing from the lower surface 23 to the upper surface 21 of the semiconductor substrate 10. In this example, the concentration of vacancies increases monotonically. In FIG. 1B, the vacancy concentration in the lower surface 23 is denoted by Dv1, and the vacancy concentration in the upper surface 21 is denoted by Dv2.

Hydrogen terminates the dangling bonds in the vacancies by heat treatment after the implantation of hydrogen ions. As a result, donors of VOH defects (termination dangling bonds) are formed. Since the vacancy concentration is often smaller than the hydrogen chemical concentration and the oxygen chemical concentration, the distribution of the termination dangling bond concentration Db is mainly limited by the distribution of the vacancy concentration. As a result, the distribution of the termination dangling bond concentration is flat, monotonically increases, or monotonically decreases from the lower surface 23 to the upper surface 21 of the semiconductor substrate 10 except for a local peak. When a portion of the local hydrogen concentration peak is excluded from the distribution of the hydrogen chemical concentration Dh, the distribution of the hydrogen chemical concentration Dh of the portion may be replaced with a straight line. Similarly, when a local peak portion is removed from each concentration distribution, the concentration distribution of the portion may be replaced with a straight line.

In FIG. 1B, the hydrogen chemical concentration in the lower surface 23 when not affected by the local hydrogen concentration peak 210 is denoted by Dh1$a$, and the hydrogen chemical concentration in the lower surface 23 when affected by the local hydrogen concentration peak 210 is denoted by Dh1$b$. Further, in FIG. 1B, the donor concentration in the lower surface 23 when not affected by the local hydrogen concentration peak 210 is denoted by Dd1$a$, and the donor concentration in the lower surface 23 when affected by the local hydrogen concentration peak 210 is denoted by Dd1b. Further, in FIG. 1B, the termination dangling bond concentration in the lower surface 23 when not affected by the local hydrogen concentration peak 210 is denoted by Db1a, and the termination dangling bond concentration in the lower surface 23 when affected by the local hydrogen concentration peak 210 is denoted by Db1b.

When the variation range of the concentration distribution in a predetermined region is 30% or less of the average value of the concentrations at both ends of the region, the distribution in the region may be flat. The above-described ratio may be 20% or less or 10% or less. The variation range of the concentration distribution is a difference between the maximum value and the minimum value of the concentration in the region.

In this example, the distribution of the hydrogen chemical concentration Dh is flat from the lower surface 23 to the entire upper surface 21 except for a local hydrogen concentration peak. That is, the variation range of the hydrogen chemical concentration distribution from the lower surface 23 to the upper surface 21 is 30% or less of the average value of the hydrogen chemical concentration Dh1 in the lower surface 23 and the hydrogen chemical concentration Dh2 in the upper surface 21.

The semiconductor substrate 10 may be provided with a hydrogen supply source in the vicinity of at least one of the upper surface 21 and the lower surface 23. The hydrogen supply source of this example is an example of the local hydrogen concentration peak 210. The hydrogen supply source (local hydrogen concentration peak 210) may be provided at a depth within 5 μm from the upper surface 21 or the lower surface 23 of the semiconductor substrate 10. In order for hydrogen to terminate the dangling bond in the pass-through region of hydrogen ions, it is preferable that sufficient hydrogen exists in the pass-through region. By providing the hydrogen supply source, a large amount of hydrogen is diffused from the hydrogen supply source toward the inside of the semiconductor substrate 10. As a result, the dangling bond can be efficiently terminated with hydrogen in the pass-through region.

A distribution obtained by connecting the concentrations at both ends of the predetermined region with a straight line may be a linear approximation distribution. The linear approximation distribution may be a straight line obtained by fitting a concentration in a predetermined region with a linear function. In addition, the linear approximation distribution may be a straight line obtained by fitting a distribution excluding local peaks of each concentration distribution with a linear function. Further, a range of a band shape having a width of 30% of the value of the linear approximation distribution around the linear approximation distribution is referred to as a band-shaped range. The monotonically increasing or decreasing concentration distribution in a predetermined region refers to a state in which the concentration values at both ends of the predetermined region are different and the concentration distribution is included in the band-shaped range described above. The band-shaped range may have a width of 20% or 10% of the value of the linear approximation distribution.

Figure 2A:
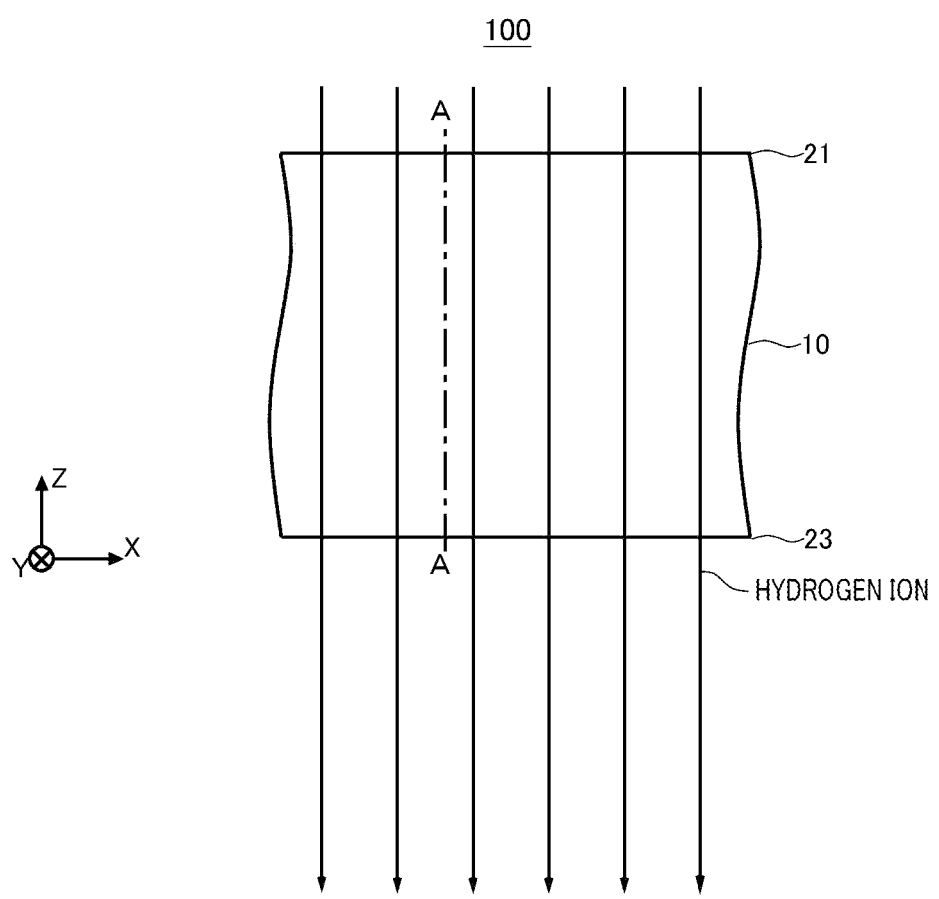
FIG. 2A is a cross-sectional view illustrating an example of the semiconductor device 100.

FIG. 2A is a cross-sectional view illustrating an example of semiconductor device 100. The semiconductor device 100 includes a semiconductor substrate 10. FIG. 2A is different from FIG. 1A in that hydrogen ions (for example, protons) are implanted so as to penetrate the semiconductor substrate 10 from the upper surface 21 of the semiconductor substrate 10. The other configurations may be the same as those in FIG. 1A.

Figure 2B:
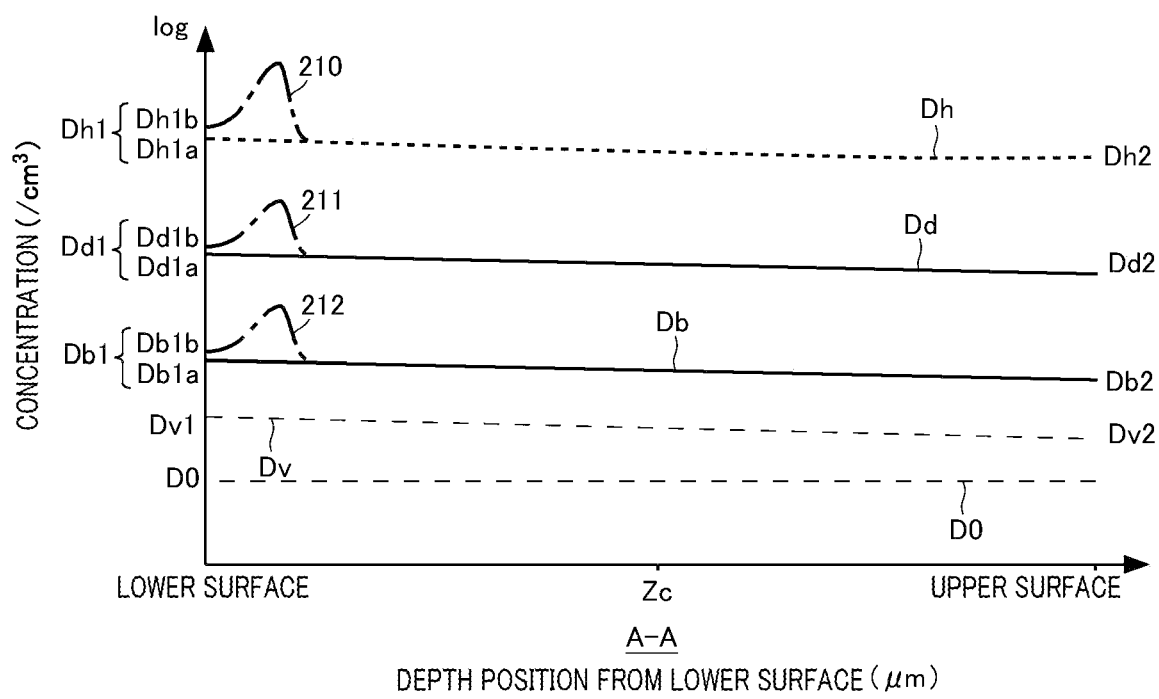
FIG. 2B illustrates an example of a distribution of hydrogen chemical concentration Dh, a distribution of donor concentration Dd, and a distribution of concentration Db of a termination dangling bond terminated with hydrogen in the depth direction at a position indicated by line A-A in FIG. 2A.

FIG. 2B illustrates an example of the distribution of the hydrogen chemical concentration Dh, the distribution of the donor concentration Dd, and the distribution of the concentration Db of the termination dangling bond terminated with hydrogen in the depth direction at the position indicated by line A-A in FIG. 2A. FIG. 2B is different from FIG. 1B in that the concentrations of Dh, Dd, Db, and Dv increase from the upper surface 21 toward the lower surface 23. The other configurations may be the same as those in FIG. 1B.

The distribution of the hydrogen chemical concentration Dh may be flat, monotonically increasing, or monotonically decreasing from the lower surface 23 to the upper surface 21 of the semiconductor substrate 10, except for a portion where a local hydrogen concentration peak is provided. In this example, the distribution of the hydrogen chemical concentration monotonously decreases toward the upper surface 21. The vacancy concentration distribution Dv2 may monotonously decrease from the lower surface 23 toward the upper surface 21 that is the implantation surface. Similarly to the vacancy concentration distribution Dv2, the doping concentration Dd2 may monotonously decrease from the lower surface 23 toward the upper surface 21.

Figure 2C:
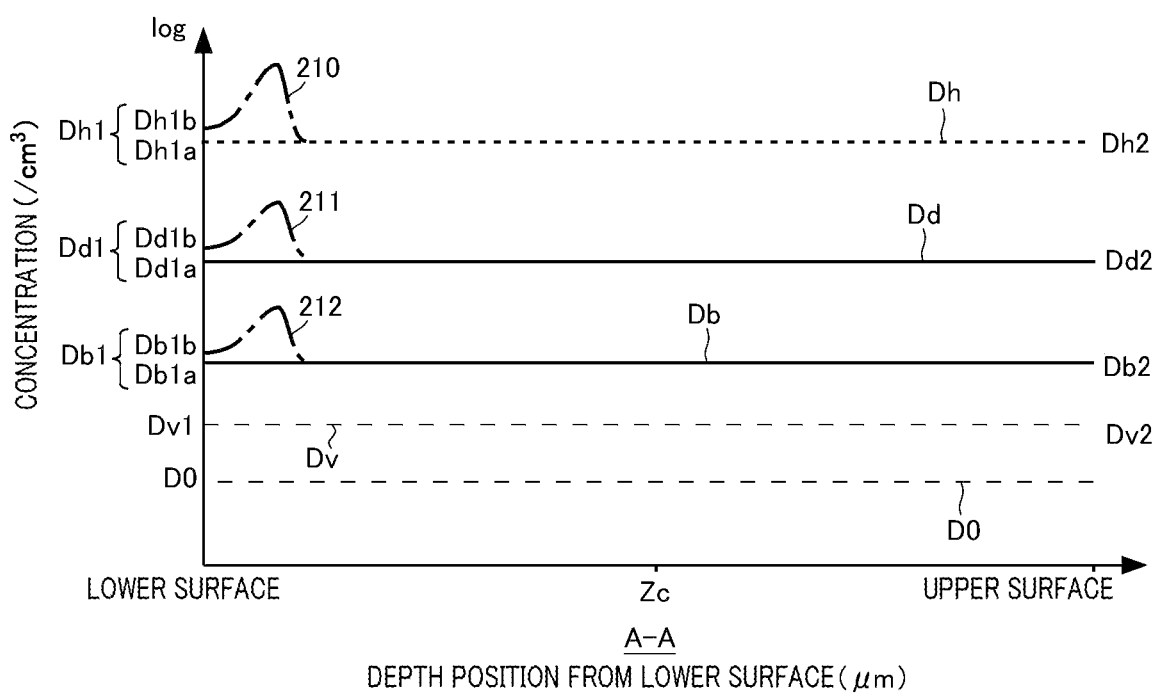
FIG. 2C illustrates another example of the distribution of hydrogen chemical concentration Dh, the distribution of donor concentration Dd, and the distribution of concentration Db of the termination dangling bond terminated with hydrogen in the depth direction at the position indicated by line A-A in FIG. 2A.

FIG. 2C illustrates another example of the distribution of the hydrogen chemical concentration Dh, the distribution of the donor concentration Dd, and the distribution of the concentration Db of the termination dangling bond terminated with hydrogen in the depth direction at the position indicated by line A-A in FIG. 2A. FIG. 2C is different from FIG. 1B in that the concentrations of Dh, Dd, Db, and Dv do not substantially increase or decrease from the upper surface 21 toward the lower surface 23, that is, are substantially uniform or flat. The other configurations may be the same as those in FIG. 1B. The hydrogen ions may be implanted from the upper surface 21 or may be implanted from the lower surface 23. The range uniquely determined by the acceleration energy of hydrogen ions may be sufficiently larger than the thickness of the semiconductor substrate 10. The range uniquely determined by the acceleration energy of hydrogen ions may be 2 times or more, 3 times or more, or 5 times or more of the thickness of the semiconductor substrate 10.

Figure 3:
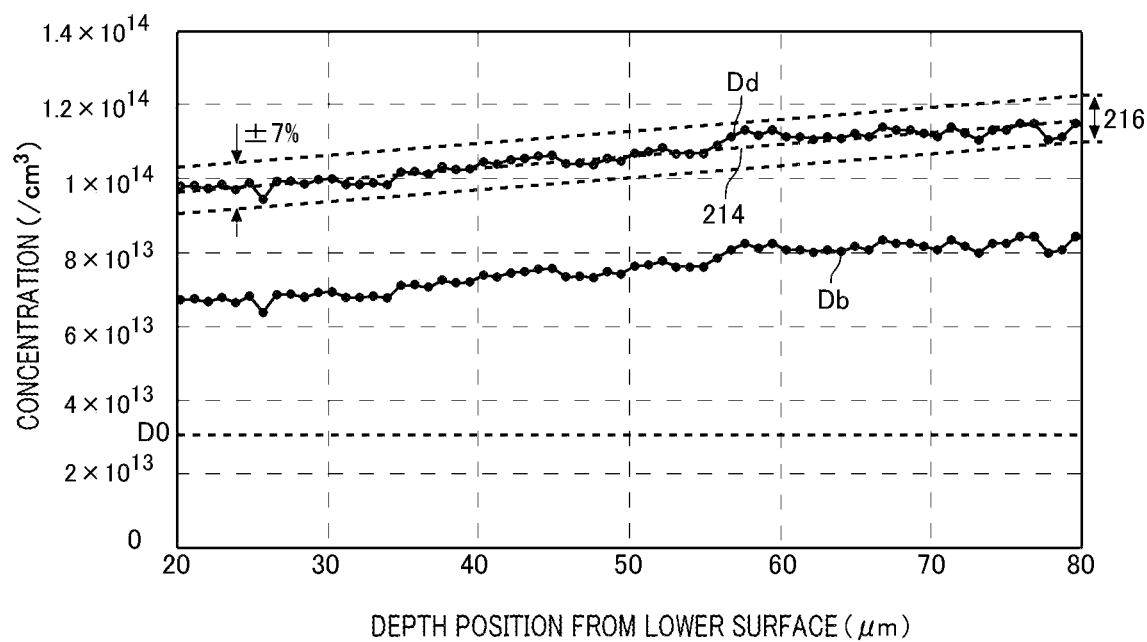
FIG. 3 is a diagram for explaining an example of a bulk donor concentration, a termination dangling bond concentration, and a flat portion of a donor concentration distribution.

FIG. 3 is a distribution example of the bulk donor concentration D0, the termination dangling bond concentration Db, and the donor concentration Dd. The thickness of the semiconductor substrate 10 of this example is 120 μm. The vertical axis in this drawing is a linear scale. The depth of 20 μm to 80 μm from the implantation surface of hydrogen ions is defined as a predetermined region. The predetermined region is a region through which hydrogen ions penetrate and in which there is no local peak in the donor concentration Dd. The thickness of the predetermined region in this example is 50% of the thickness of the semiconductor substrate 10. The bulk donor concentration D0 in this example is $3.1 \times 10^{13}/cm^3$, corresponding to 150 Ωcm. The sum of the bulk donor concentration D0 at each depth and the value of the termination dangling bond Db is the donor concentration Dd.

A linear approximation distribution 214 of the donor concentration Dd is a distribution in which the concentration increases as the distance from the implantation surface increases. In this example, in a predetermined region through which hydrogen ions penetrate, the donor concentration Dd varies by about ±7% with respect to the linear approximation distribution 214. The variation of the donor concentration Dd is defined as a band-shaped range 216. That is, the width of the band-shaped range 216 in this example is ±7% of the value of the linear approximation distribution 214. In a predetermined region having a thickness of 30% or more of the thickness of the semiconductor substrate 10, when the distribution of the donor concentration Db exists within the band-shaped range 216, the distribution of the donor concentration Db may be a flat distribution. That is, the predetermined region may be a termination dangling bond flat region.

Figure 4:
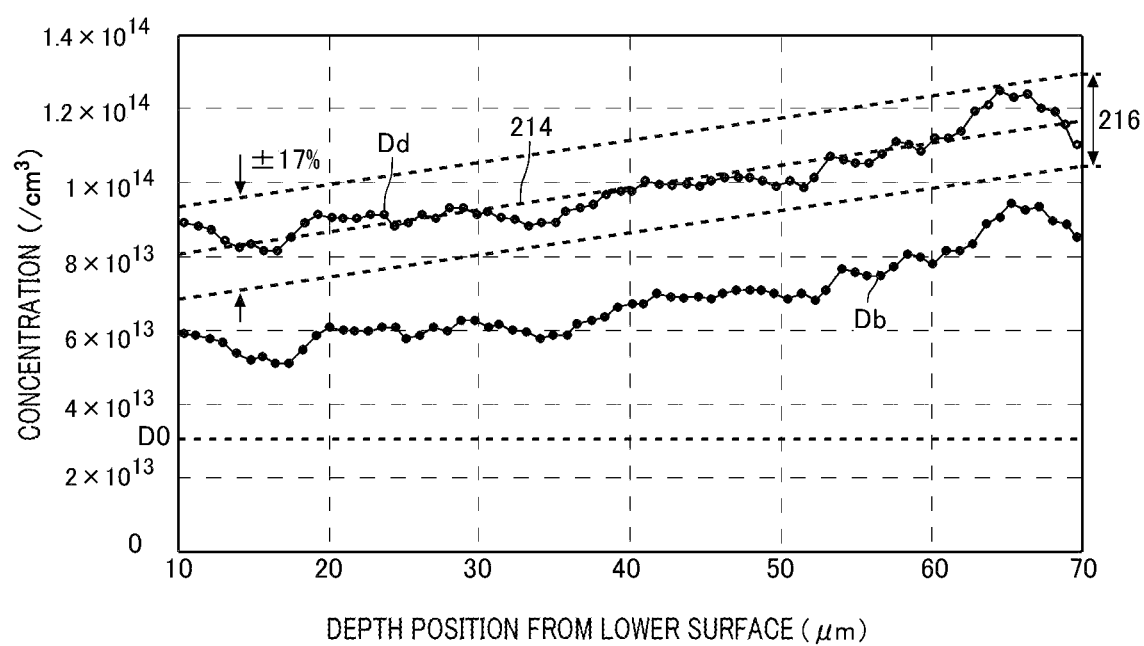
FIG. 4 is a diagram for explaining another example of the bulk donor concentration, the termination dangling bond concentration, and the flat portion of the donor concentration distribution.

FIG. 4 is another example of the distribution of the bulk donor concentration D0, the termination dangling bond concentration Db, and the donor concentration Dd. In this example, the depth position of the predetermined region, the distribution of the termination dangling bond concentration Db, and the distribution of the donor concentration Dd are different from those in FIG. 3. In this example, a region from 10 μm to 70 μm in depth from the implantation surface of hydrogen ions is defined as a predetermined region. Also in this example, the thickness of the predetermined region with respect to the thickness (120 μm) of the semiconductor substrate 10 is 50%, which is the same as the example of FIG. 3.

The linear approximation distribution 214 of the donor concentration Dd is a distribution in which the concentration increases as the distance from the implantation surface increases. However, the linear approximation distribution 214 of this example has a larger slope of increase than the linear approximation distribution 214 of FIG. 3. In addition, in a predetermined region, the donor concentration Dd varies by about ±17% with respect to the linear approximation distribution 214. The variation of the donor concentration Dd is defined as a band-shaped range 216. The width of the band-shaped range 216 is ±17% of the value of the linear approximation distribution 214. Therefore, in a predetermined region having a thickness of 30% or more of the thickness of the semiconductor substrate 10, when the distribution of the donor concentration Db exists within the band-shaped range 216, the distribution of the donor concentration Db may be a flat distribution. That is, this predetermined region may be a termination dangling bond flat region.

The termination dangling bond flat region may be provided in a range of 40% or more, a range of 20% or more, or a range of 10% or more of the thickness of the semiconductor substrate. The termination dangling bond flat region may be provided in a range of 60% or less, a range of 70% or less, a range of 80% or less, or a range of 90% or less of the thickness of the semiconductor substrate. The absolute value of the slope of the linear approximation distribution 214 in the termination dangling bond flat region may be from $0/(cm^3 \cdot \mu m)$ to $2 \times 10^{12}/(cm^3 \cdot \mu m)$, or may be larger than $0/(cm^3 \cdot \mu m)$ and $1 \times 10^{12}/(cm^3 \cdot \mu m)$ or less with respect to the depth (μm). Furthermore, the absolute value of the slope of the linear approximation distribution 214 in the termination dangling bond flat region may be from $1 \times 10^{10}/(cm^3 \cdot \mu m)$ to $1 \times 10^{12}/(cm^3 \cdot \mu m)$, and may be from $1 \times 10^{10}/(cm^3 \cdot \mu m)$ $5 \times 10^{11}/(cm^3 \cdot \mu m)$ with respect to the depth (μm). Here, $5 \times 10^{11}/(cm^3 \cdot \mu m)$ is the same slope (equivalent) as $5 \times 10^{15}/cm^4$.

A semi-logarithmic slope may be used as another index of the slope of the linear approximation distribution 214. The position of one end of a predetermined region is defined as x1 (cm), and the position of the other end is defined as x2 (cm). The concentration at x1 is denoted by N1 ($/cm^3$), and the concentration at x2 is denoted by N2 ($/cm^3$). A semi-logarithmic slope η (/cm) in a predetermined region is defined as $\eta = (\log_{10}(N2) - \log_{10}(N1))/(x2-x1)$. The absolute value of the semi-logarithmic slope η of the linear approximation distribution 214 in the termination dangling bond flat region may be from 0/cm to 50/cm, and may be from 0/cm 30/cm. Furthermore, the absolute value of the semi-logarithmic slope η of the linear approximation distribution 214 in the termination dangling bond flat region may be from 0/cm to 20/cm, and may be from 0/cm 10/cm. In the termination dangling bond flat region, a donor concentration flat region in which the concentration distribution is substantially flat may be provided for the donor concentration. The slope in the donor concentration flat region may be the same as the slope in the termination dangling bond flat region. The semi-logarithmic slope in the donor concentration flat region may be the same as the semi-logarithmic slope in the termination dangling bond flat region.

In the distribution of the hydrogen chemical concentration Dh illustrated in FIG. 1B, the difference between the hydrogen chemical concentration Dh1 in the lower surface 23 and the hydrogen chemical concentration Dh2 in the upper surface 21 may be 50% or less, 30% or less, or 10% or less of the average value of Dh1 and Dh2. As the difference is smaller, the donor concentration of the semiconductor substrate 10 can be made uniform. The larger the range of hydrogen ions is, the smaller the difference can be made.

In the pass-through region through which hydrogen ions have passed, it is considered that vacancies (V, VV, etc) generated by passing of hydrogen are distributed at approximately uniform concentration in the depth direction. In addition, oxygen (O) implanted at the time of manufacturing the semiconductor substrate 10 or the like is also considered to be uniformly distributed in the depth direction. On the other hand, in the process of manufacturing the semiconductor device 100, oxygen may diffuse from the upper surface 21 or the lower surface 23 of the semiconductor substrate 10 to the outside of the semiconductor substrate 10 in the process of performing the high temperature treatment of 1100° C. or higher. As a result, the oxygen concentration may decrease toward the upper surface 21 or the lower surface 23 of the semiconductor substrate 10.

In this example, hydrogen is approximately uniformly distributed from the lower surface 23 to the entire upper surface 21 of the semiconductor substrate 10. Therefore, termination dangling bonds (that is, VOH defects) are approximately uniformly distributed over the entire semiconductor substrate 10. The semiconductor substrate 10 may be provided with a termination dangling bond flat region in which the concentration of the termination dangling bonds is flat, monotonically increases, or monotonically decreases. The definition of flat, monotonic increase or monotonic decrease in the termination dangling bond concentration distribution is the same as the example of the hydrogen chemical concentration distribution. In addition, a region where the hydrogen chemical concentration is more than 100 times the bulk donor concentration and both the hydrogen chemical concentration distribution and the donor concentration distribution are flat or monotonically increase or decrease may be used as the termination dangling bond flat region.

In the example of FIG. 1B, the termination dangling bond flat region is provided over the entire semiconductor substrate 10 in the depth direction, but the termination dangling bond flat region may be provided in a part of the semiconductor substrate 10. For example, in a region in which hydrogen ions are locally implanted, such as a buffer region described later, the termination dangling bond concentration also has a local peak. A region other than the region into which hydrogen ions are locally implanted may be a termination dangling bond flat region. In the semiconductor substrate 10, the termination dangling bond flat region may be continuously provided over a range from 30% to 80% of the thickness of the semiconductor substrate 10 in the depth direction. The termination dangling bond flat region may be provided over 50% or more, 60% or more, or 70% or more of the thickness of the semiconductor substrate 10.

The concentration of the termination dangling bonds can be controlled with high accuracy by the dosage of hydrogen ions. As a result, the donor concentration can be accurately controlled over the entire semiconductor substrate 10. The donor concentration of the semiconductor substrate 10 is higher than the bulk donor concentration throughout the upper surface 21 to the lower surface 23.

The hydrogen supply source (local hydrogen concentration peak) 210 illustrated in FIG. 1B has a hydrogen chemical concentration higher than the hydrogen chemical concentration of the linear approximation distribution 214 in the termination dangling bond flat region. The maximum value of the hydrogen chemical concentration of the hydrogen supply source may be 10 times or more, or 100 times or more of the hydrogen chemical concentration of the linear approximation distribution 214. The hydrogen chemical concentration of the hydrogen supply source may be $1 \times 10^{16}/\text{cm}^3$ or more, $1 \times 10^{17}/\text{cm}^3$ or more, or $1 \times 10^{18}/\text{cm}^3$ or more.

Figure 5:
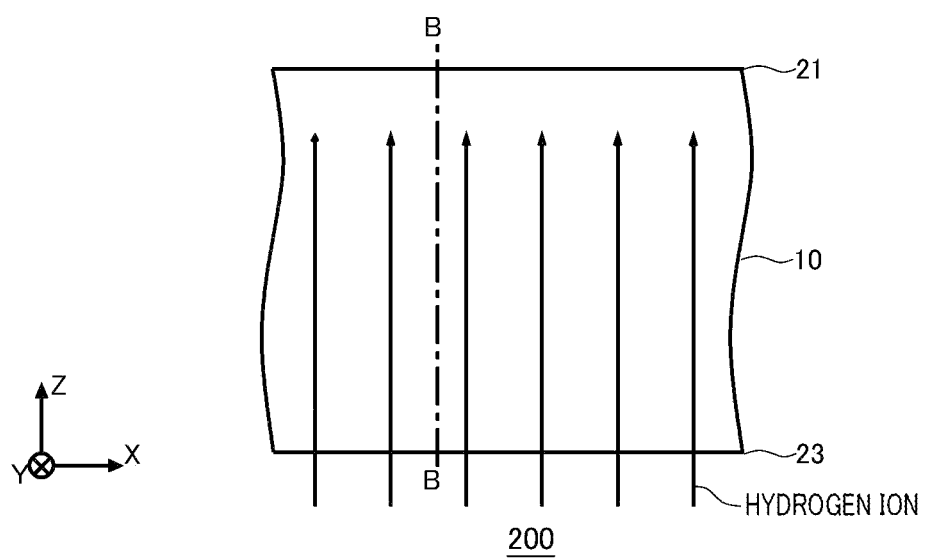
FIG. 5 is a diagram for explaining a semiconductor device 200 according to a comparative example.

FIG. 5 is a diagram for explaining a semiconductor device 200 according to a comparative example. The semiconductor device 200 implants hydrogen ions from the lower surface 23 of the semiconductor substrate 10 into a region on the upper surface 21 side of the semiconductor substrate 10. That is, the range of hydrogen ions is smaller than the thickness of the semiconductor substrate 10 and larger than half of the thickness. As an example, the range of hydrogen ions is smaller than ¾ of the thickness of the semiconductor substrate 10 and larger than half of the thickness.

Figure 6:
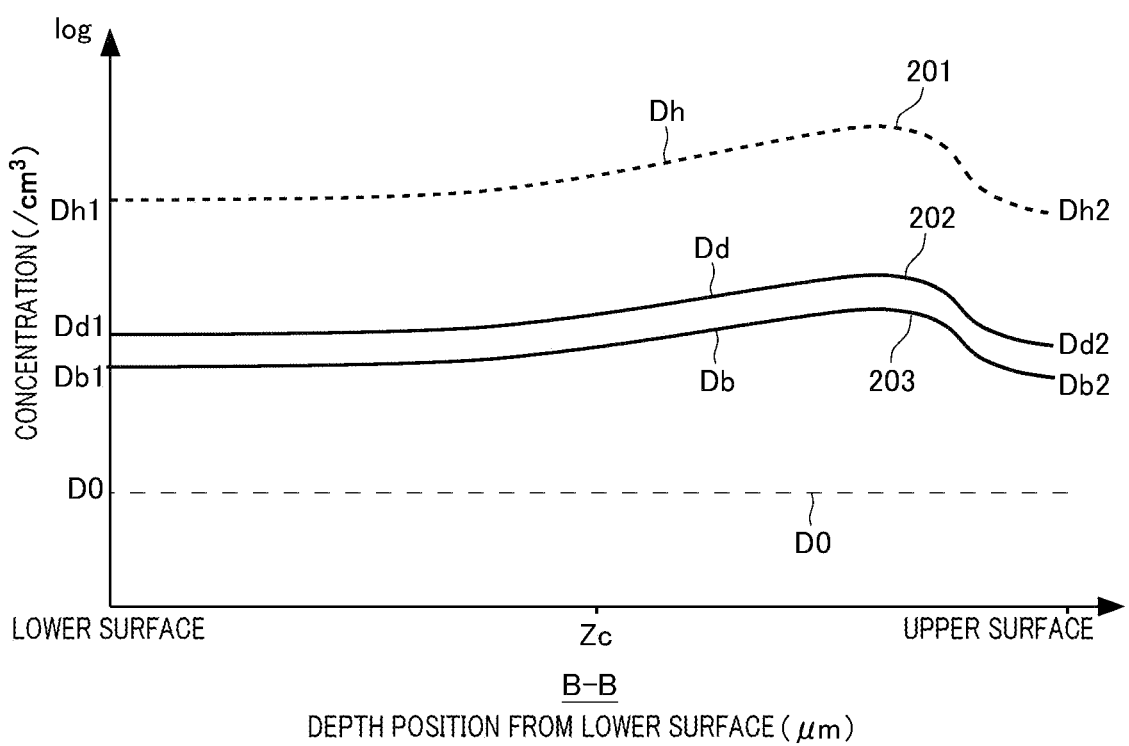
FIG. 6 illustrates a hydrogen chemical concentration distribution, a donor concentration distribution, and a concentration distribution of a termination dangling bond terminated with hydrogen in the depth direction at a position indicated by line B-B in FIG. 5.

FIG. 6 illustrates the distribution of the hydrogen chemical concentration Dh, the distribution of the donor concentration Dd, and the distribution of the concentration Db of the termination dangling bond terminated with hydrogen in the depth direction at the position indicated by line B-B in FIG. 5. When a range of hydrogen ions is arranged in the semiconductor substrate 10, a large amount of hydrogen is implanted in the vicinity of the range. Therefore, the hydrogen chemical concentration distribution has a concentration peak 201 in the vicinity of the range. Similarly, the termination dangling bond concentration distribution has a concentration peak 203 and the donor concentration distribution has a concentration peak 202.

In this example, hydrogen ions are implanted from the lower surface 23 to a deep position away from the lower surface 23 of the semiconductor substrate 10. As a result, the donor concentration can be adjusted in a wide range in the depth direction of the semiconductor substrate 10. However, in each concentration distribution, a concentration peak having a relatively large half-value width occurs.

As described above, when the range of hydrogen ions is arranged inside the semiconductor substrate 10, the hydrogen chemical concentration distribution is not flattened, and an unnecessary peak is generated in the donor concentration. Therefore, the peak may affect the characteristics of the semiconductor device 100. On the other hand, according to the example described in FIG. 1A to FIG. 2B, since the range of hydrogen ions is arranged outside the semiconductor substrate 10, the hydrogen chemical concentration distribution can be flattened. Therefore, generation of an unnecessary peak in the donor concentration can be suppressed.

Even when the range of hydrogen ions is matched with the upper surface 21 of the semiconductor substrate 10, each concentration distribution has a peak at the position of the upper surface 21. For this reason, it is difficult to planarize the donor concentration, the hydrogen chemical concentration distribution, and the like up to the upper surface 21.

Figure 7:
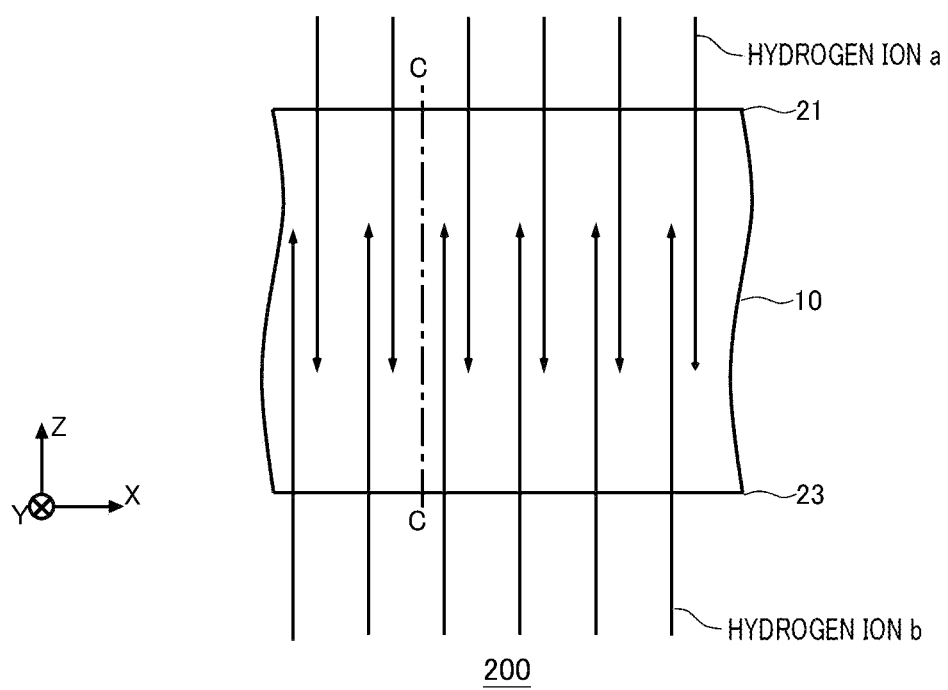
FIG. 7 is a diagram for explaining the semiconductor device 200 according to the comparative example.

FIG. 7 is a diagram for explaining the semiconductor device 200 according to a comparative example. The semiconductor device 200 implants hydrogen ions from the lower surface 23 of the semiconductor substrate 10 to a region on the upper surface 21 side of the semiconductor substrate 10, and also implants hydrogen ions from the upper surface 21 of the semiconductor substrate 10 to a region on the lower surface 23 side of the semiconductor substrate 10. As an example, the range of hydrogen ions is smaller than ¾ of the thickness of the semiconductor substrate 10 and larger than half of the thickness.

Figure 8:
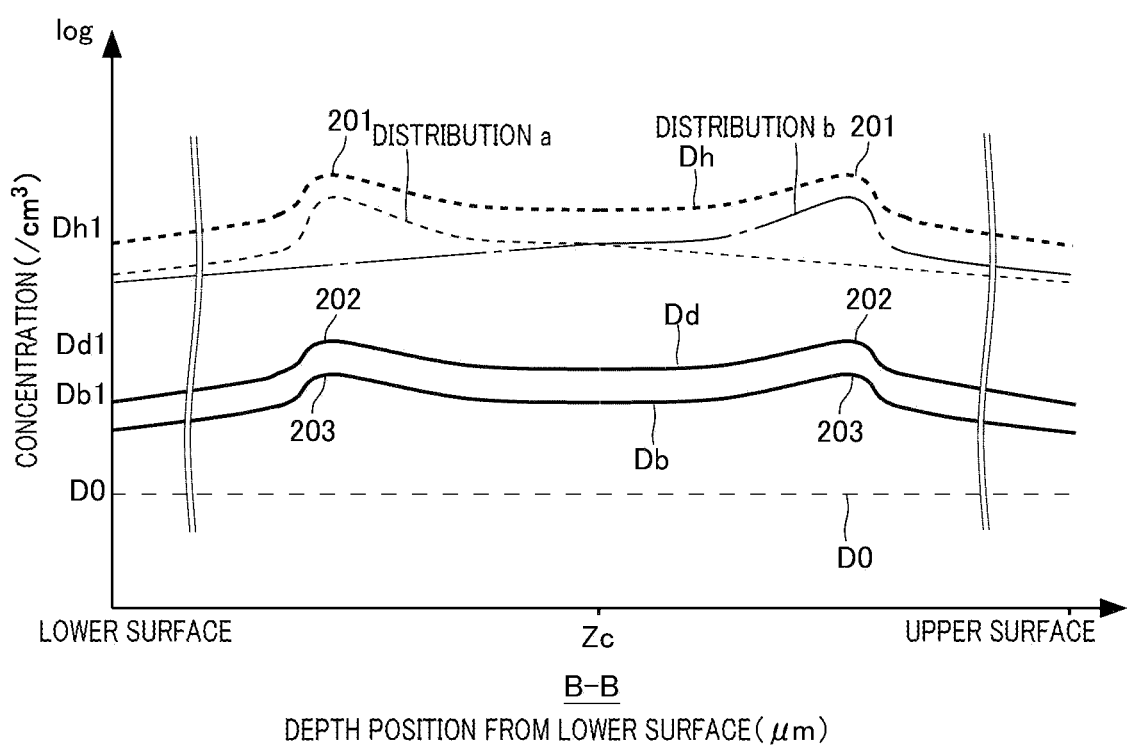
FIG. 8 illustrates a hydrogen chemical concentration distribution, a donor concentration distribution, and a concentration distribution of a termination dangling bond terminated with hydrogen in a depth direction at a position indicated by line C-C in FIG. 7.

FIG. 8 illustrates the distribution of the hydrogen chemical concentration Dh, the distribution of the donor concentration Dd, and the distribution of the concentration Db of the termination dangling bond terminated with hydrogen in the depth direction at the position indicated by line C-C in FIG. 7. In FIG. 8, a hydrogen chemical concentration distribution by hydrogen ions implanted onto the lower surface 23 side is defined as a distribution a, and a hydrogen chemical concentration distribution by hydrogen ions implanted onto the upper surface 21 side is defined as a distribution b. The distribution a has a concentration peak on the lower surface 23 side, and the distribution b has a concentration peak on the upper surface 21 side.

The hydrogen chemical concentration distribution of the semiconductor substrate 10 is a distribution obtained by synthesizing the distribution a and the distribution b. Thus, the hydrogen chemical concentration distribution has two concentration peaks 201. Similarly, the termination dangling bond concentration distribution and the donor concentration distribution each have two concentration peaks (202, 203).

By implanting hydrogen ions from different planes, the hydrogen chemical concentration distribution becomes nearly flat, but the concentration peaks 201 near the respective ranges remain. For this reason, it is difficult to flatten the donor concentration distribution and the like. On the other hand, according to the example described in FIG. 1A to FIG. 2B, since the range of hydrogen ions is arranged outside the semiconductor substrate 10, the hydrogen chemical concentration distribution can be flattened. Therefore, generation of an unnecessary peak in the donor concentration can be suppressed.

Figure 9:
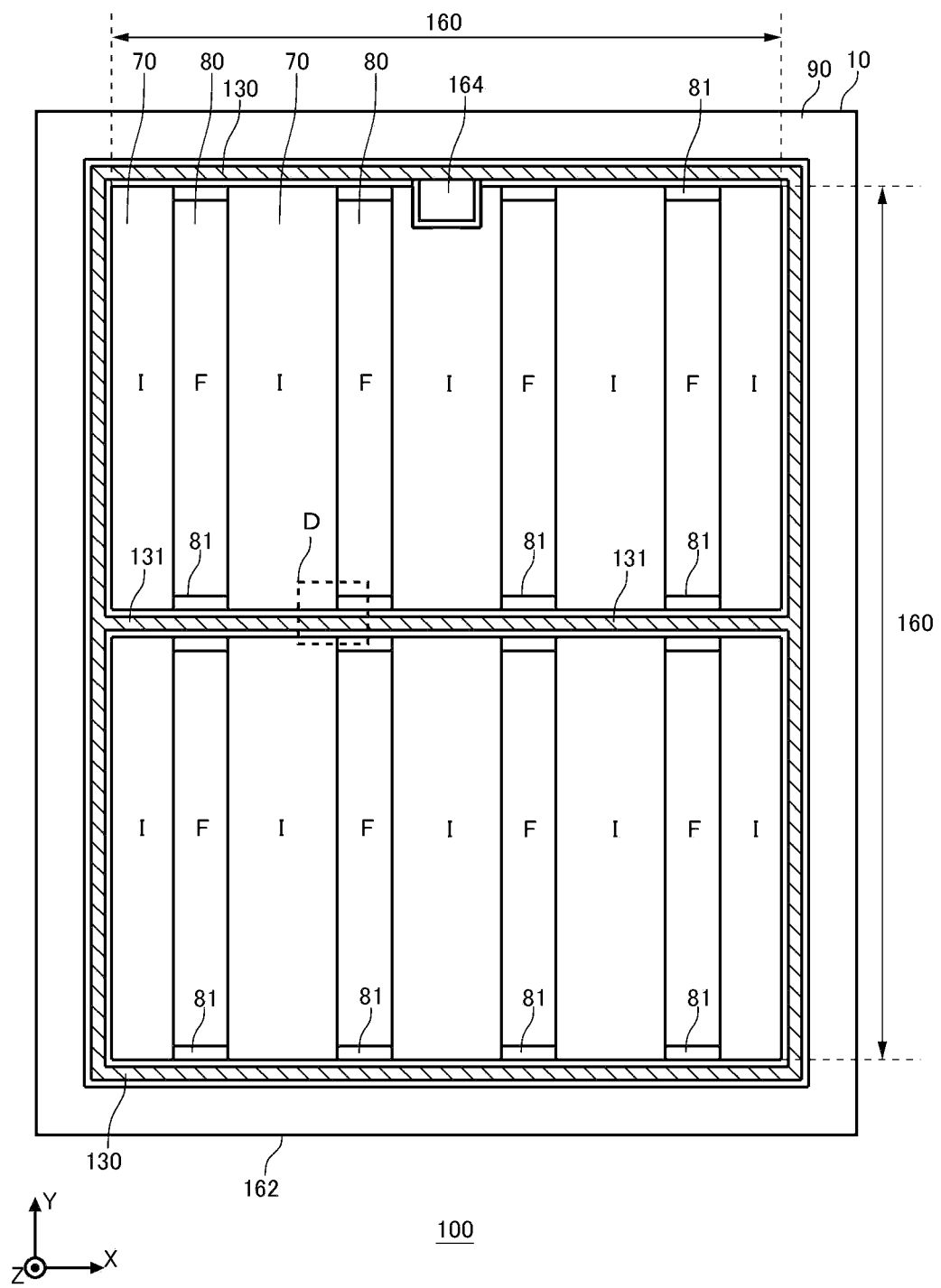
FIG. 9 is a top view illustrating an example of the semiconductor device 100.

FIG. 9 is a top view illustrating an example of the semiconductor device 100. FIG. 9 illustrates a position where each member is projected on the upper surface of the semiconductor substrate 10. In FIG. 9, only some members of the semiconductor device 100 are illustrated, and some members are omitted.

The semiconductor device 100 includes the semiconductor substrate 10. The semiconductor substrate 10 may have the hydrogen chemical concentration distribution, the termination dangling bond concentration distribution, and the donor concentration distribution described in FIG. 1A to FIG. 8. However, the semiconductor substrate 10 may further have another concentration peak different from each concentration peak described in FIG. 1A to FIG. 8. As in a buffer region 20 to be described later, hydrogen ions may be implanted to form a region of the N type in the semiconductor substrate 10. In this case, the hydrogen chemical concentration distribution may have a local hydrogen concentration peak in addition to the hydrogen chemical concentration distribution described in FIG. 1A to FIG. 8. Further, as in the emitter region 12 to be described later, an impurity of the N type other than hydrogen such as phosphorus may be implanted to form a region of the N type in the semiconductor substrate 10. In this case, the donor concentration distribution may have a local donor concentration peak in addition to the donor concentration distribution described in FIG. 1A to FIG. 8.

The semiconductor substrate 10 has an edge 162 in a top view. In the case of simply mentioning "in a top view" in the present specification, it means viewing from the upper surface side of the semiconductor substrate 10. The semiconductor substrate 10 of this example includes two sets of edges 162 facing each other in a top view. In FIG. 9, the X axis and the Y axis are parallel to any one of the edges 162. In addition, the Z axis is perpendicular to the upper surface of the semiconductor substrate 10.

The semiconductor substrate 10 is provided with an active portion 160. The active portion 160 is a region in which a main current flows in the depth direction, between the upper surface and the lower surface of the semiconductor substrate 10 in a case where the semiconductor device 100 operates. An emitter electrode is provided above the active portion 160, but is omitted in FIG. 9.

In the active portion 160, there is provided at least one of a transistor portion 70 which includes a transistor device such as an IGBT, and a diode portion 80 which includes a diode device such as a freewheeling diode (FWD). In the example of FIG. 9, the transistor portion 70 and the diode portion 80 are disposed alternately along a predetermined arrangement direction (the X axis direction in this example) in the upper surface of the semiconductor substrate 10. In another example, only one of the transistor portion 70 and the diode portion 80 may be provided in the active portion 160.

In FIG. 9, Symbol "I" is attached to the region where the transistor portion 70 is disposed, and Symbol "F" is attached to the region where the diode portion 80 is disposed. In the present specification, a direction perpendicular to the arrangement direction in a top view may be referred to as an extending direction (the Y axis direction in FIG. 9). Each of the transistor portion 70 and the diode portion 80 may have a longitudinal length in the extending direction. In other words, the length of the transistor portion 70 in the Y axis direction is larger than the width in the X axis direction. Similarly, the length of the diode portion 80 in the Y axis direction may be larger than the width in the X axis direction. The extending direction of the transistor portion 70 and the diode portion 80 and the longitudinal direction of each trench portion described later may be the same.

The diode portion 80 includes a cathode region of the N+ type in a region in contact with the lower surface of the semiconductor substrate 10. In the present specification, the region where the cathode region is provided is referred to as the diode portion 80. In other words, the diode portion 80 is a region overlapping with the cathode region in a top view. In the lower surface of the semiconductor substrate 10, a collector region of the P+ type may be provided in the region other than the cathode region. In the present specification, an extension region 81 extending from the diode portion 80 to a gate runner to be described later in the Y axis direction may also be included in the diode portion 80. In the lower surface of the extension region 81, a collector region is provided.

The transistor portion 70 includes a collector region of the P+ type in a region in contact with the lower surface of the semiconductor substrate 10. In addition, in the transistor portion 70, there is periodically disposed a gate structure, which includes an emitter region of the N type, a base region of the P type, a gate conductive portion, and a gate insulating film, on the upper surface side on the semiconductor substrate 10.

The semiconductor device 100 may include one or more pads on the upper side of the semiconductor substrate 10. The semiconductor device 100 of this example includes a gate pad 164. The semiconductor device 100 may include pads such as an anode pad, a cathode pad, and a current detection pad. Each pad is disposed in the vicinity of the edge 162. The vicinity of the edge 162 indicates a region between the edge 162 and the emitter electrode in a top view. When mounting the semiconductor device 100, each pad may be connected to an external circuit via a wiring such as a wire.

A gate potential is applied to the gate pad 164. The gate pad 164 is electrically connected to the conductive portion of a gate trench portion of the active portion 160. The semiconductor device 100 includes a gate runner that connects the gate pad 164 and the gate trench portion. In FIG. 9, the gate runner is hatched with inclined lines.

The gate runner of this example includes an outer circumferential gate runner 130 and an active-side gate runner 131. The outer circumferential gate runner 130 is disposed between the active portion 160 and the edge 162 of the semiconductor substrate 10 in a top view. The outer circumferential gate runner 130 of this example surrounds the active portion 160 in a top view. The region surrounding the outer circumferential gate runner 130 in a top view may be called the active portion 160. In addition, the outer circumferential gate runner 130 is connected to the gate pad 164. The outer circumferential gate runner 130 is disposed on the upper side of the semiconductor substrate 10. The outer circumferential gate runner 130 may be a metal wiring containing aluminum or the like.

The active-side gate runner 131 is provided in the active portion 160. With the provision of the active-side gate runner 131 in the active portion 160, it is possible to reduce a variation in wiring length from the gate pad 164 in each region of the semiconductor substrate 10.

The active-side gate runner 131 is connected to the gate trench portion of the active portion 160. The active-side gate runner 131 is disposed on the upper side of the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided to extend in the X axis direction from one outer circumferential gate runner 130 in almost the center of the Y axis direction up to the other outer circumferential gate runner 130 so as to traverse the active portion 160. In a case where the active portion 160 is divided by the active-side gate runner 131, the transistor portion 70 and the diode portion 80 may be alternately disposed in the X axis direction in each divided region.

In addition, the semiconductor device 100 may be provided with a temperature sense portion (not illustrated) which is a PN junction diode formed of polysilicon or the like, and a current detection portion (not illustrated) which simulates the operation of the transistor portion provided in the active portion 160.

The semiconductor device 100 of this example includes an edge termination structure portion 90 between the active portion 160 and the edge 162 in a top view. The edge termination structure portion 90 of this example is disposed between the outer circumferential gate runner 130 and the edge 162. The edge termination structure portion 90 reduces an electric field strength on the upper surface side of the semiconductor substrate 10. The edge termination structure portion 90 may be provided with at least one of a guard ring, a field plate, and a RESURF provided annularly around the active portion 160.

Figure 10:
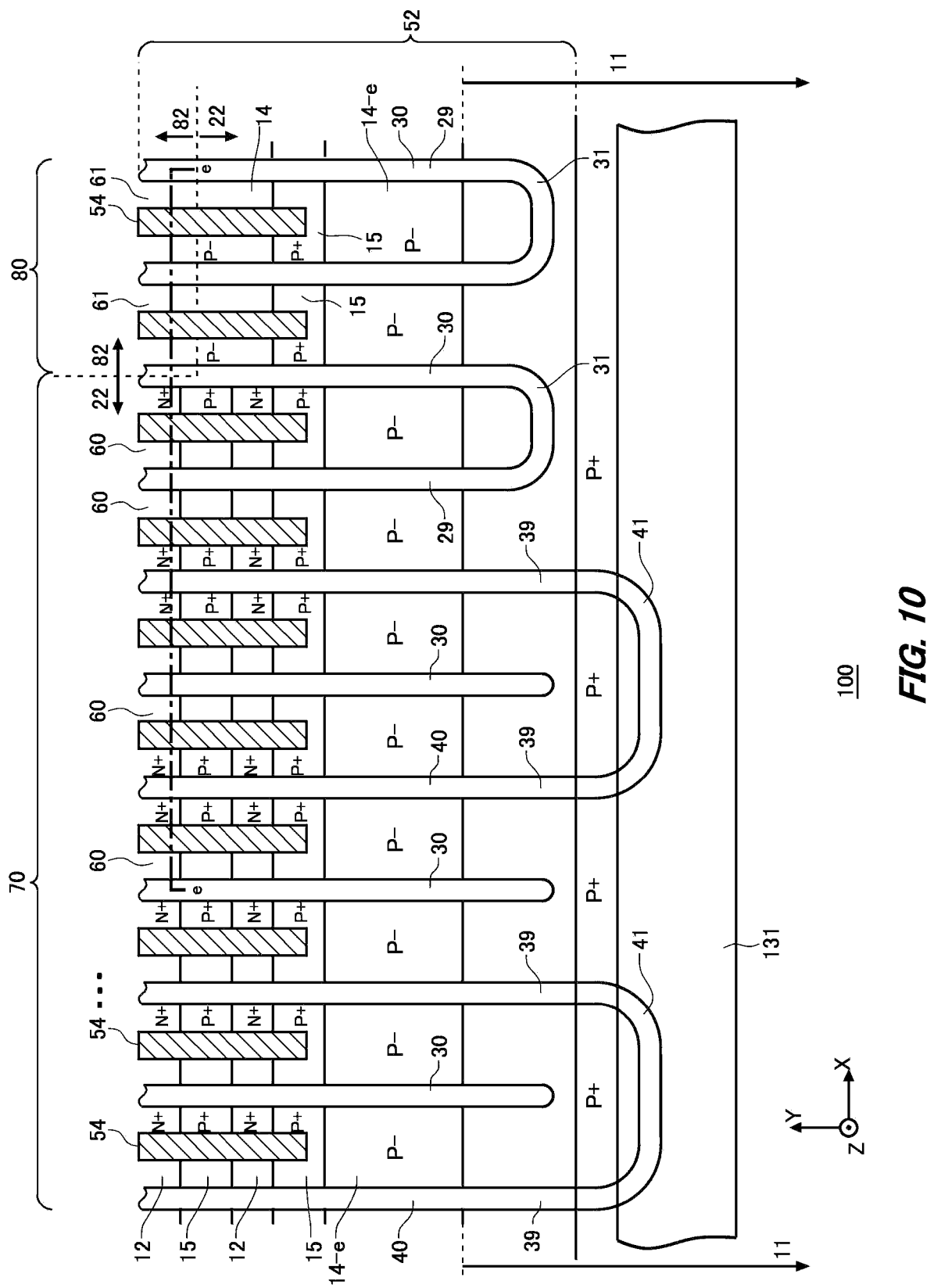
FIG. 10 is an enlarged view of a region D in FIG. 9.

FIG. 10 is an enlarged view of a region D in FIG. 9. The region D is a region where the transistor portion 70, the diode portion 80, and the active-side gate runner 131 are included. The semiconductor device 100 of this example is provided with a gate trench portion 40, a dummy trench portion 30, a well region 11, an emitter region 12, a base region 14, and a contact region 15, which are provided in the inside on the upper surface side of the semiconductor substrate 10. The gate trench portion 40 and the dummy trench portion 30 each are an example of the trench portion. In addition, the semiconductor device 100 of this example is provided with an emitter electrode 52 and the active-side gate runner 131 which are provided on the upper side of the upper surface of the semiconductor substrate 10. The emitter electrode 52 and the active-side gate runner 131 are provided to be separated from each other.

An interlayer dielectric film is provided between the upper surface of the semiconductor substrate 10 and the emitter electrode 52 and the active-side gate runner 131, but is omitted in FIG. 10. In the interlayer dielectric film of this example, a contact hole 54 is provided to pass through the interlayer dielectric film. In FIG. 10, each contact hole 54 is hatched with oblique lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 in an edge portion 41 of the gate trench portion 40 in the Y axis direction. The active-side gate runner 131 is not connected to the dummy conductive portion in the dummy trench portion 30.

The emitter electrode 52 is formed of a material containing metal. FIG. 10 illustrates a range in which the emitter electrode 52 is provided. For example, at least a partial region of the emitter electrode 52 is formed of aluminum or an aluminum-silicon alloy, for example, a metal alloy such as AlSi or AlSiCu. The emitter electrode 52 may have a barrier metal formed of titan or a titan compound in the lower layer of the region formed of aluminum or the like. Further, in the contact hole, a plug formed with tungsten buried therein may be included to be in contact with the barrier metal, aluminum, or the like.

The well region 11 is provided to be overlapped with the active-side gate runner 131. The well region 11 is provided to extend with a predetermined width even in a range where the active-side gate runner 131 is not overlapped. The well region 11 of this example is provided to be separated from the end of the contact hole 54 in the Y axis direction toward the active-side gate runner 131. The well region 11 is a region of a second conductivity type in which its doping concentration is higher than that of the base region 14. The base region 14 in this example is a P− type, and the well region 11 is a P+ type.

Each of the transistor portion 70 and the diode portion 80 includes a plurality of trench portions disposed in the arrangement direction. In the transistor portion 70 of this example, one or more gate trench portions 40 and one or more dummy trench portions 30 are alternately provided along the arrangement direction. In the diode portion 80 of this example, the plurality of dummy trench portions 30 are provided along the arrangement direction. In the diode portion 80 of this example, the gate trench portion 40 is not provided.

The gate trench portion 40 of this example may include two linear portions 39 (trench portions that are linear along the extending direction) extending along the extending direction perpendicular to the arrangement direction, and the edge portion 41 for connecting the two linear portions 39. The extending direction in FIG. 10 is the Y axis direction.

At least a part of the edge portion 41 is desirably provided in a curved shape in a top view. The ends of two linear portions 39 in the Y axis direction are connected to the edge portion 41, so that the electric field strength in the end portion of the linear portion 39 can be reduced.

In the transistor portion 70, the dummy trench portion 30 is provided between the linear portions 39 of the gate trench portion 40. Between the linear portions 39, one dummy trench portion 30 may be provided, or a plurality of dummy trench portions 30 may be provided. The dummy trench portion 30 may be in a linear shape extending in the extending direction, or may include a linear portion 29 and an edge portion 31 similarly to the gate trench portion 40. The semiconductor device 100 illustrated in FIG. 10 includes both the linear dummy trench portion 30 having no edge portion 31, and the dummy trench portion 30 having the end portion 31.

A diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. In other words, the bottom of each trench portion in the depth direction is covered with the well region 11 at the end portion of each trench portion in the Y axis direction. With this configuration, the electric field strength in the bottom of each trench portion can be reduced.

A mesa portion is provided between the trench portions in the arrangement direction. The mesa portion indicates a region sandwiched between the trench portions in the semiconductor substrate 10. As an example, the upper end of the mesa portion is the upper surface of the semiconductor substrate 10. The depth position of the lower end of the mesa portion is the same as the depth position of the lower end of the trench portion. The mesa portion of this example is provided to extend in the extending direction (Y axis direction) along the trench in the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion indicates each of the mesa portion 60 and the mesa portion 61.

Each mesa portion is provided with the base region 14. In the base region 14 exposed to the upper surface of the semiconductor substrate 10 in the mesa portion, a region disposed nearest to the active-side gate runner 131 is referred to as a base region 14-e. In FIG. 10, the base region 14-e disposed in one end portion in the extending direction of each mesa portion is illustrated. However, the base region 14-e is disposed even the other end portion of each mesa portion. In each mesa portion, at least one of the emitter region 12 of a first conductivity type and the contact region 15 of the second conductivity type may be provided in the region sandwiched between the base regions 14-e in a top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion in the X axis direction to the other trench portion. As an example, the contact region 15 and the emitter region 12 of the mesa portion 60 are alternately disposed along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided on the upper surface of the mesa portion 61. The contact region 15 may be provided in contact with each of the base regions 14-e in a region sandwiched between the base regions 14-e on the upper surface of the mesa portion 61. The base region 14 may be provided in a region sandwiched between the contact regions 15 on the upper surface of the mesa portion 61. The base region 14 may be disposed in the entire region sandwiched between the contact regions 15.

The contact hole 54 is provided above each mesa portion. The contact hole 54 is disposed in a region sandwiched between the base regions 14-e. The contact hole 54 of this example is provided above each region of the contact region 15, the base region 14, and the emitter region 12. The contact hole 54 is not provided in a region corresponding to the base region 14-e and the well region 11. The contact hole 54 may be disposed at the center in the arrangement direction (X axis direction) of the mesa portion 60.

In the diode portion 80, a cathode region 82 of the N+ type is provided in a region adjacent to the lower surface of the semiconductor substrate 10. On the lower surface of the semiconductor substrate 10, a collector region 22 of the P+ type may be provided in a region where the cathode region 82 is not provided. The cathode region 82 and the collector region 22 are provided between the lower surface 23 of the semiconductor substrate 10 and the buffer region 20. In FIG. 10, the boundary between the cathode region 82 and the collector region 22 is indicated by a dotted line.

The cathode region 82 is disposed away from the well region 11 in the Y axis direction. As a result, a distance between the region (well region 11) of the P type having a relatively high doping concentration and formed up to a deep position and the cathode region 82 is secured, and the withstand voltage can be improved. The end of the cathode region 82 of this example in the Y axis direction is disposed away from the well region 11 than the end of the contact hole 54 in the Y axis direction. In another example, the end of the cathode region 82 in the Y axis direction may be disposed between the well region 11 and the contact hole 54.

Figure 11:
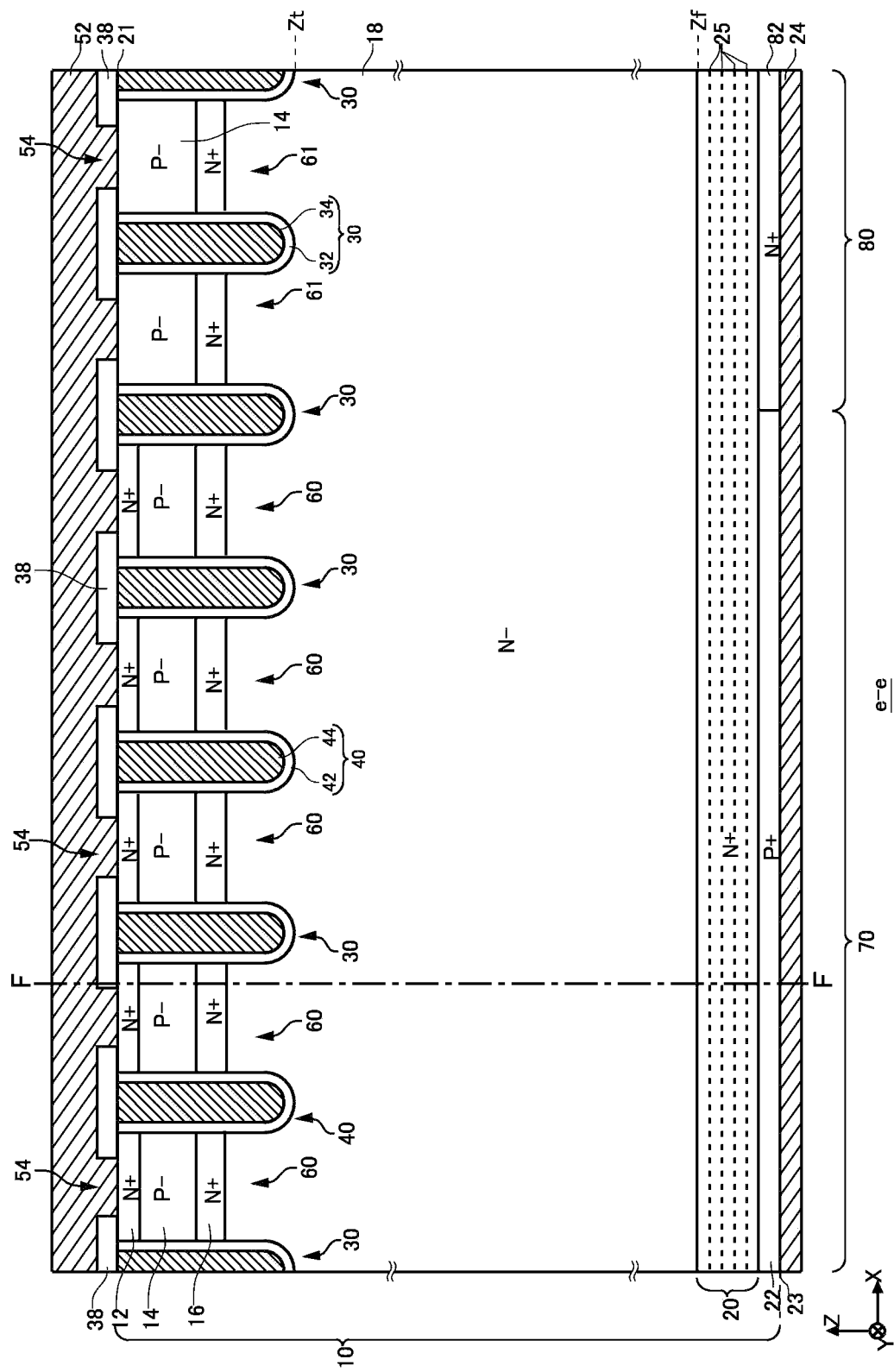
FIG. 11 is a diagram illustrating an example of an e-e cross section in FIG. 10.

FIG. 11 is a diagram illustrating an example of an e-e cross section in FIG. 10. The e-e cross section is an XZ plane passing through the emitter region 12 and the cathode region 82. The semiconductor device 100 of this example includes the semiconductor substrate 10, an interlayer dielectric film 38, the emitter electrode 52, and a collector electrode 24 in the cross section.

The interlayer dielectric film 38 is provided on the upper surface of the semiconductor substrate 10. The interlayer dielectric film 38 is a film including at least one of a dielectric film such as silicate glass to which an impurity such as boron or phosphorus is added, a thermal oxide film, and other dielectric films. The interlayer dielectric film 38 is provided with the contact hole 54 described in FIG. 10.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are made of a metal material such as aluminum. In the present specification, the direction (Z axis direction) connecting the emitter electrode 52 and the collector electrode 24 is referred to as a depth direction.

The semiconductor substrate 10 has a drift region 18 of the N type or the N− type. The drift region 18 is provided in each of the transistor portion 70 and the diode portion 80.

In the mesa portion 60 of the transistor portion 70, an emitter region 12 of the N+ type and a base region 14 of the P− type are provided in order from the upper surface 21 side of the semiconductor substrate 10. The drift region 18 is provided below the base region 14. The mesa portion 60 may be provided with an accumulation region 16 of the N+ type. The accumulation region 16 is disposed between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an region of the N+ type having a higher doping concentration than the drift region 18. That is, the accumulation region 16 has a higher donor concentration than the drift region 18. By providing the high-concentration accumulation region 16 between the drift region 18 and the base region 14, the carrier injection enhancement effect (IE effect) can be increased, and the ON voltage can be reduced. The accumulation region 16 may be provided so as to cover the entire lower surface of the base region 14 in each mesa portion 60.

The mesa portion 61 of the diode portion 80 is provided with a base region 14 of the P− type in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, a buffer region 20 of the N+ type may be provided under the drift region 18. The doping concentration of the buffer region 20 is higher than the doping concentration of the drift region 18. The buffer region 20 has a concentration peak 25 having a higher doping concentration than the drift region 18. The doping concentration of the concentration peak 25 refers to the doping concentration at the maximum of the concentration peak 25. As the doping concentration of the drift region 18, an average value of the doping concentration in a region where the doping concentration distribution is approximately flat may be used.

The buffer region 20 of this example has three or more concentration peaks 25 in the depth direction (Z axis direction) of the semiconductor substrate 10. The concentration peak 25 of the buffer region 20 may be provided at the same depth position as the concentration peak of hydrogen (proton) or phosphorus, for example. The buffer region 20 may work as a field stop layer that prevents a depletion layer extending from the lower end of the base region 14 from reaching the collector region 22 of the P+ type and the cathode region 82 of the N+ type. In the present specification, the depth position of the upper end of the buffer region 20 is defined as Zf. The depth position Zf may be a position where the doping concentration is higher than the doping concentration of the drift region 18.

In the transistor portion 70, the collector region 22 of the P+ type is provided below the buffer region 20. The acceptor concentration of the collector region 22 is higher than the acceptor concentration of the base region 14. The collector region 22 may include the same acceptor as the base region 14, and may include a different acceptor. The acceptor of the collector region 22 is, for example, boron.

In the diode portion 80, the cathode region 82 of the N+ type is provided below the buffer region 20. The donor concentration of the cathode region 82 is higher than the donor concentration of the drift region 18. The donor of the cathode region 82 is, for example, hydrogen or phosphorus. Elements to be donors and acceptors in each region are not limited to the examples described above. The collector region 22 and the cathode region 82 are exposed to the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. In the region where at least any one of the emitter region 12, the contact region 15, and the accumulation region 16 is provided, each trench portion also penetrates these doping regions and reaches the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

As described above, the transistor portion 70 is provided with the gate trench portion 40 and the dummy trench portion 30. The diode portion 80 is provided with the dummy trench portion 30 and is not provided with the gate trench portion 40. In this example, the boundary between the diode portion 80 and the transistor portion 70 in the X axis direction is the boundary between the cathode region 82 and the collector region 22.

The gate trench portion 40 includes a gate trench provided on the upper surface 21 of the semiconductor substrate 10, a gate insulating film 42, and a gate conductive portion 44. The gate insulating film 42 is provided to cover the inner wall of the gate trench. The gate insulating film 42 may be formed by oxidizing or nitriding the semiconductor of the inner wall of the gate trench. The gate conductive portion 44 is provided inside the gate insulating film 42 in the gate trench. That is, the gate insulating film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. When a predetermined gate voltage is applied to the gate conductive portion 44, a channel by an inversion layer of electrons is formed in a surface layer of the boundary in contact with the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy insulating film 32, and a dummy conductive portion 34. The dummy conductive portion 34 is electrically connected to the emitter electrode 52. The dummy insulating film 32 is provided to cover the inner wall of the dummy trench. The dummy conductive portion 34 is provided in the dummy trench and is provided inside the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered with the interlayer dielectric film 38 in the upper surface 21 of the semiconductor substrate 10. Note that the bottoms of the dummy trench portion 30 and the gate trench portion 40 may have a curved surface shape protruding downward (a curved shape in a cross section). In the present specification, the depth position of the lower end of the gate trench portion 40 is defined as Zt.

The drift region 18 may have the same donor concentration as the donor concentration described in FIG. 1A to FIG. 8. That is, the drift region 18 has a donor concentration determined mainly by the bulk donor concentration and the hydrogen donor (VOH defect) concentration. A dopant is locally implanted in a region other than the drift region 18. Therefore, the doping concentration in the region other than the drift region 18 is different from the donor concentration described in FIG. 1A to FIG. 8.

Figure 12A:
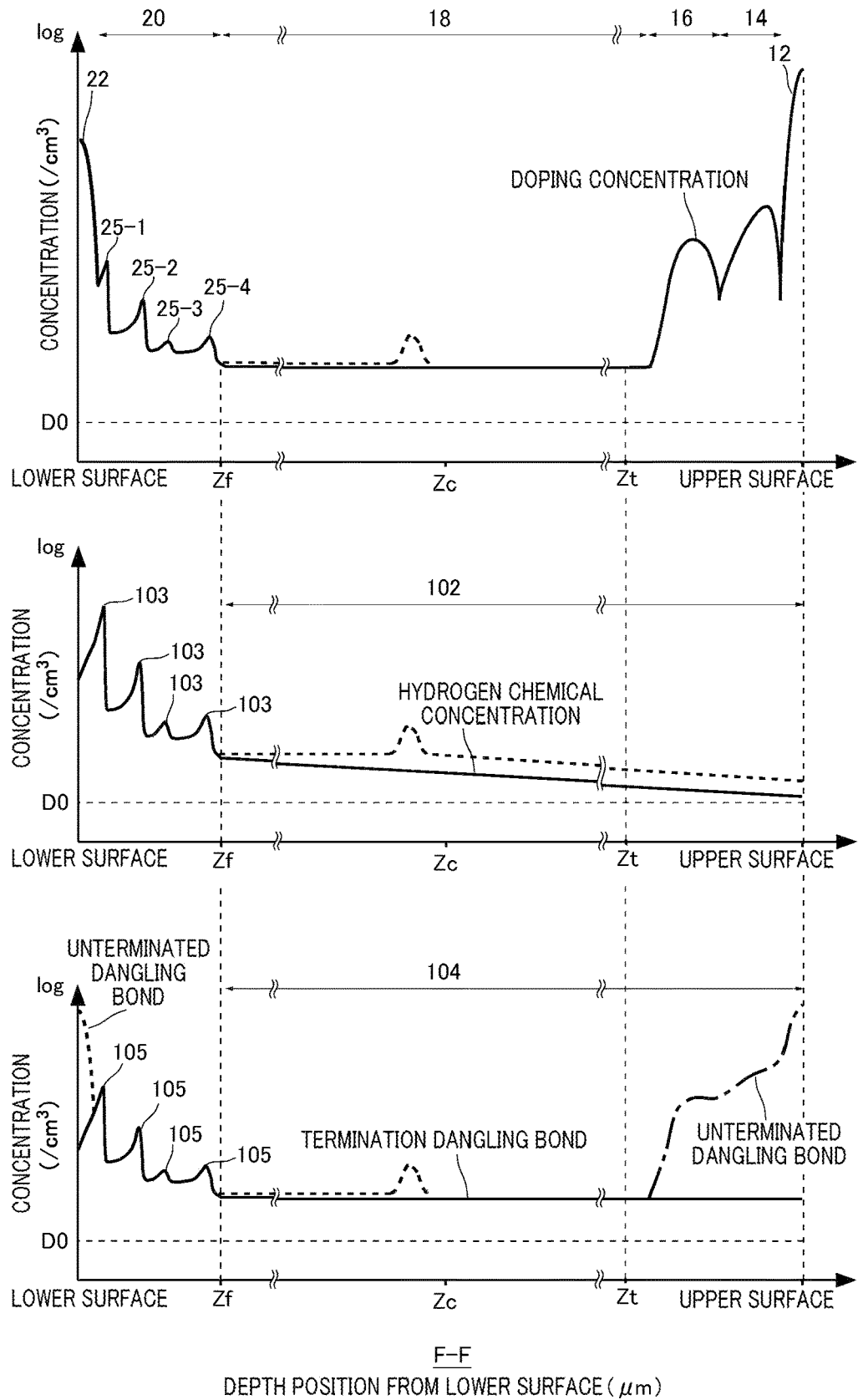
FIG. 12A is a diagram illustrating an example of a doping concentration distribution, a hydrogen chemical concentration distribution, and a termination dangling bond concentration distribution taken along line F-F in FIG. 11.

FIG. 12A is a diagram illustrating an example of the doping concentration distribution, the hydrogen chemical concentration distribution, and the termination dangling bond concentration distribution taken along line F-F in FIG. 11. The doping concentration distribution may have a shape in which a local concentration peak in each region is superimposed on the donor concentration distribution illustrated in FIG. 1A to FIG. 8.

In the entire semiconductor substrate 10, bulk donors such as phosphorus and VOH defects (also referred to as hydrogen donor or termination dangling bond) due to hydrogen ion implantation penetrating the semiconductor substrate 10 are approximately evenly distributed. The emitter region 12 contains a dopant of the N type such as phosphorus. The base region 14 contains a dopant of the P type such as boron. The accumulation region 16 includes a dopant of the N type such as phosphorus or hydrogen.

The buffer region 20 of this example has a plurality of concentration peaks 25-1, 25-2, 25-3, and 25-4 in the doping concentration distribution. Each concentration peak 25 may be formed by locally implanting hydrogen ions. In other examples, each concentration peak 25 may be formed by implanting a dopant of the N type such as phosphorus. The collector region 22 contains a dopant of the P type such as boron. The cathode region 82 illustrated in FIG. 11 contains a dopant of the N type such as phosphorus.

The drift region 18 in this example is a region in which a dopant other than hydrogen and the bulk donor is not intentionally implanted. The drift region 18 may be a region from the upper end of the buffer region 20 to the lower end of the accumulation region 16 (or the lower end Zt of the trench portion). Hydrogen may be locally implanted into the drift region 18. In FIG. 12A, an example of each distribution when hydrogen is locally implanted into the drift region 18 is indicated by a broken line.

The hydrogen chemical concentration distribution in this example has a plurality of local hydrogen concentration peaks 103 in the buffer region 20. The half-value width of the hydrogen concentration peak 103 is $\frac{1}{10}$ or less of the thickness of the semiconductor substrate 10 in the depth direction. The hydrogen chemical concentration distribution is flat or monotonically increases or decreases except in the region where the local hydrogen concentration peak 103 is provided. In the region 102 from the upper end Zf of the buffer region 20 to the upper surface 21 of the semiconductor substrate 10, the hydrogen chemical concentration distribution is flat or monotonically increases or decreases.

In this example, the hydrogen chemical concentration in the drift region 18 monotonously decreases toward the upper surface 21. When the buffer region 20 is close to the lower surface 23 and the hydrogen in the buffer region diffuses toward the upper surface 21, the hydrogen chemical concentration monotonously decreases toward the upper surface 21 as in this example. The hydrogen chemical concentration in the upper surface 21 may be the minimum hydrogen chemical concentration in the semiconductor substrate 10.

In order to have a donor concentration higher than the bulk donor concentration D0 throughout the drift region 18, a sufficiently high concentration of hydrogen atoms may be present throughout the semiconductor substrate 10. Specifically, the hydrogen chemical concentration in the upper surface 21 may be higher than the bulk donor concentration D0, may be higher than the minimum peak donor concentration of the donor concentration peak of the buffer region 20, and may be higher than the maximum peak donor concentration of the donor concentration peak of the buffer region 20. Further, the hydrogen chemical concentration in the upper surface 21 may be $1 \times 10^{14}/cm^3$ or more, $1 \times 10^{15}/cm^3$ or more, or $1 \times 10^{16}/cm^3$ or more.

In addition, the hydrogen chemical concentration between the base region 14 or the accumulation region 16 and the upper surface 21 may be higher than the bulk donor concentration D0, may be higher than the minimum peak donor concentration of the donor concentration peak of the buffer region 20, and may be higher than the maximum peak donor concentration of the donor concentration peak of the buffer region 20. Further, the hydrogen chemical concentration between the base region 14 or the accumulation region 16 and the upper surface 21 may be $1 \times 10^{14}/cm^3$ or more, $1 \times 10^{15}/cm^3$ or more, or $1 \times 10^{16}/cm^3$ or more. As described above, the dangling bond of the region through which the hydrogen ions have passed can be terminated with a sufficient amount of hydrogen. In this example, the hydrogen concentration peak 103 closest to the lower surface 23 may be a hydrogen supply source (local hydrogen concentration peak 210 in FIG. 1B).

In another example, hydrogen may be locally implanted into the accumulation region 16. In this case, in the region 102 from the upper end Zf of the buffer region 20 to the upper surface 21 of the semiconductor substrate 10, the hydrogen chemical concentration distribution is flat or monotonically increases or decreases except for the accumulation region 16.

The termination dangling bond concentration distribution has a termination dangling bond flat region 104 and a local concentration peak 105. The concentration peak 105 is disposed at the same depth position as the local hydrogen concentration peak 103 in the hydrogen chemical concentration distribution.

The termination dangling bond flat region 104 in this example includes a center position Zc in the depth direction of the semiconductor substrate 10. At least a part of the drift region 18 may be the termination dangling bond flat region 104. The entire drift region 18 in this example is the termination dangling bond flat region 104. The termination dangling bond flat region 104 may be provided from the upper end Zf of the buffer region 20 to the upper surface 21 of the semiconductor substrate 10.

There is a case where the dangling bonds are locally formed by locally implanting helium or the like into the drift region 18, and a lifetime control region for controlling the lifetime of the carrier is formed. In this case, a portion of the drift region 18 other than the region into which particles such as helium are locally implanted may be the termination dangling bond flat region 104.

In a region where a dopant other than hydrogen is locally implanted, such as the emitter region 12, the base region 14, the accumulation region 16, and the collector region 22, the dangling bonds are formed by implantation of the dopant. In addition, since there is almost no hydrogen in the region, the dangling bond may remain without being terminated with hydrogen. In FIG. 12A, a distribution example of the unterminated dangling bond not terminated with hydrogen is indicated by a chain line.

As in this example, whether hydrogen implanted from the lower surface 23 passes through the semiconductor substrate 10 by passing through the upper surface 21 may be determined based on whether the following two characteristics are provided. Characteristic (A): The hydrogen chemical concentration monotonically decreases from a peak closest to the upper surface 21 among the concentration peaks of the hydrogen chemical concentration to the upper surface 21. Characteristic (B): At least the doping concentration of the entire drift region 18 is higher than the bulk donor concentration D0. In other words, there is no position where the donor concentration substantially matches between the bulk donor concentration and the doping concentration over the entire semiconductor substrate 10. When the semiconductor device has both the characteristic (A) and the characteristic (B), it can be regarded that hydrogen implanted from the lower surface 23 passes through the upper surface 21 to pass through the semiconductor substrate 10.

Figure 12B:
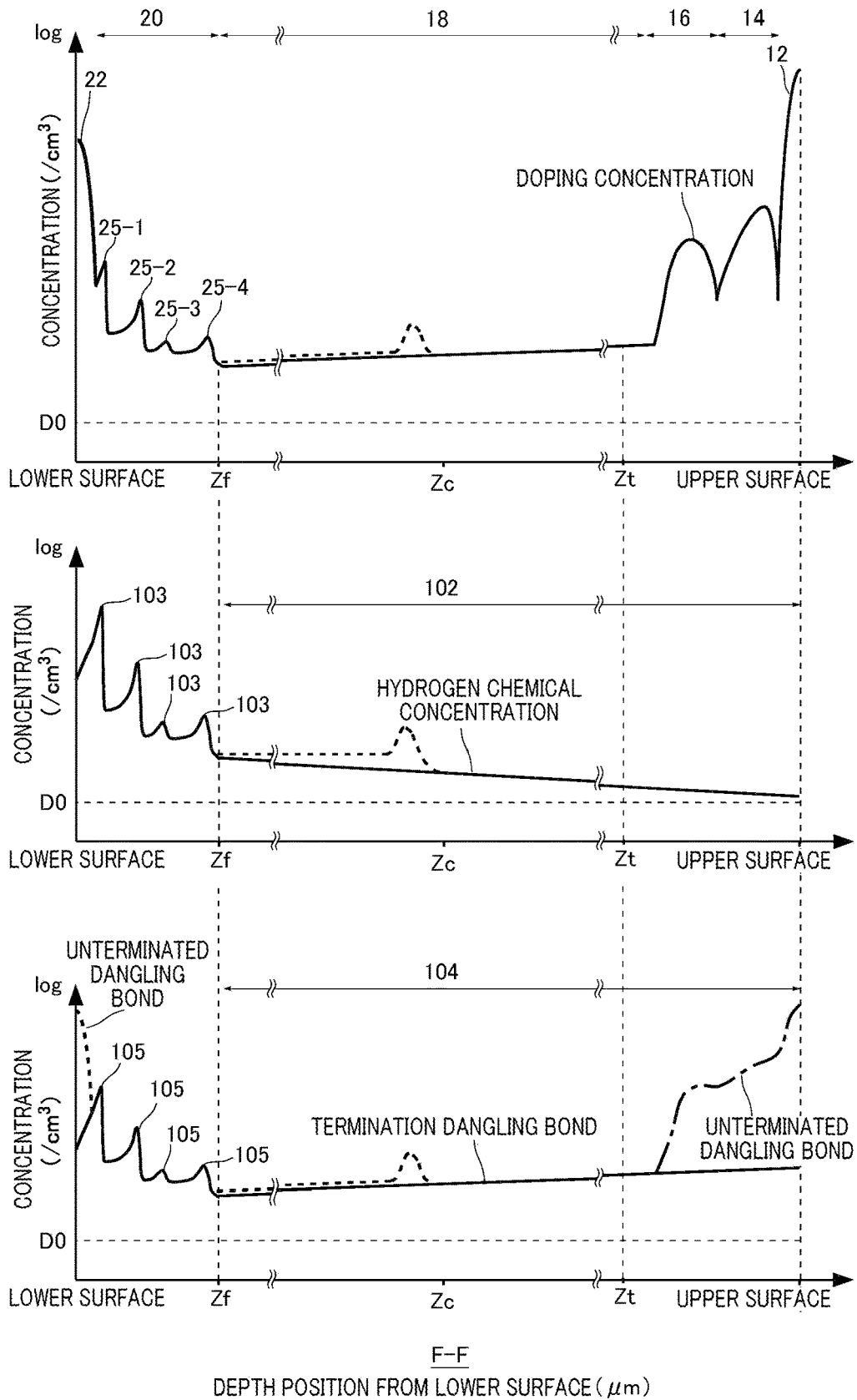
FIG. 12B is a diagram illustrating another example of the doping concentration distribution, the hydrogen chemical concentration distribution, and the termination dangling bond concentration distribution taken along line F-F in FIG. 11.

FIG. 12B is a diagram illustrating another example of the doping concentration distribution, the hydrogen chemical concentration distribution, and the termination dangling bond concentration distribution taken along line F-F in FIG. 11. This example is an example in which the doping concentration and the termination dangling bond concentration in the drift region 18 monotonously increase from the lower surface 23 toward the upper surface 21. Other concentration distributions may be similar to the example of FIG. 12A.

The hydrogen chemical concentration in the drift region 18 in this example may monotonically decrease toward the upper surface 21. When the buffer region 20 is close to the lower surface 23 and the hydrogen in the buffer region diffuses towards the upper surface 21, the hydrogen chemical concentration monotonically decreases towards the upper surface 21. The hydrogen chemical concentration in the upper surface 21 may be the minimum hydrogen chemical concentration in the semiconductor substrate 10.

The slope of the increase or decrease in the concentration in each distribution may be similar to the slope of the linear approximation distribution 214 described above. The doping concentration of the drift region 18 at the boundary between the drift region 18 and the accumulation region 16 may be smaller than the maximum doping concentration of the buffer region 20, and may be smaller than the smallest peak concentration among the peak concentrations of the buffer region 20.

One or more doping concentration peaks may be provided or two or more doping concentration peaks may be provided inside the drift region 18. In the example of FIG. 12B, an example in which one peak is provided inside the drift region 18 is indicated by a broken line. In this example, whether hydrogen ions have passed from the upper surface 21 toward the lower surface 23 can be determined in the same manner as in FIG. 12A.

Figure 12C:
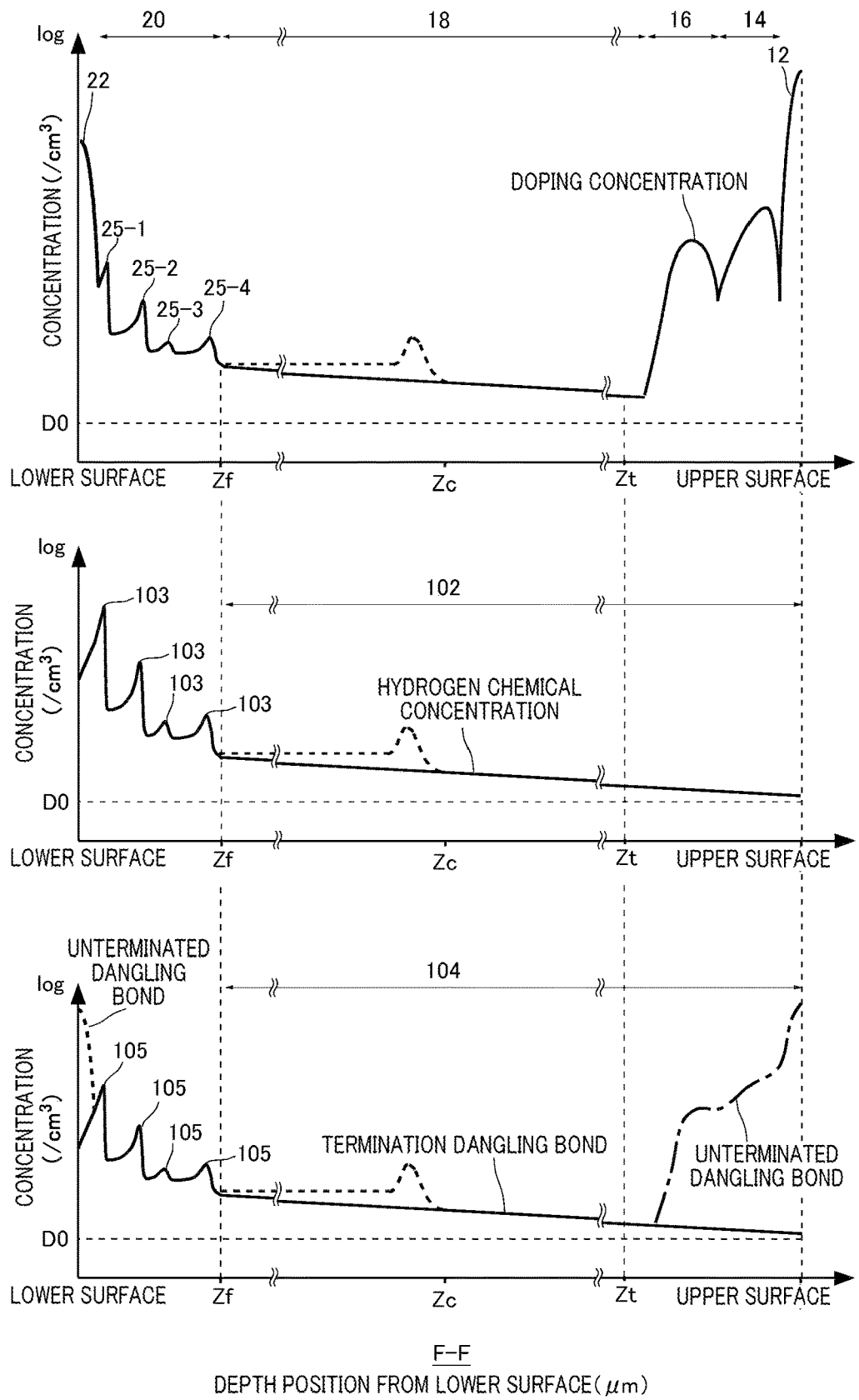
FIG. 12C is a diagram illustrating another example of the doping concentration distribution, the hydrogen chemical concentration distribution, and the termination dangling bond concentration distribution taken along line F-F in FIG. 11.

FIG. 12C is a diagram illustrating another example of the doping concentration distribution, the hydrogen chemical concentration distribution, and the termination dangling bond concentration distribution taken along line F-F in FIG. 11. This example is an example in which the doping concentration and the termination dangling bond concentration in the drift region 18 monotonously decrease from the lower surface 23 toward the upper surface 21. Other concentration distributions may be similar to the example of FIG. 12A.

The hydrogen chemical concentration in the drift region 18 in this example may monotonically decrease toward the upper surface 21. When the buffer region 20 is close to the lower surface 23 and the hydrogen in the buffer region diffuses towards the upper surface 21, the hydrogen chemical concentration monotonically decreases towards the upper surface 21. The hydrogen chemical concentration in the upper surface 21 may be the minimum hydrogen chemical concentration in the semiconductor substrate 10.

The slope of the increase or decrease in the concentration in each distribution may be similar to the slope of the linear approximation distribution 214 described above. The doping concentration of the drift region 18 at the boundary between the drift region 18 and the accumulation region 16 may be smaller than the maximum doping concentration of the buffer region 20, and may be smaller than the smallest peak concentration among the peak concentrations of the buffer region 20.

One or more doping concentration peaks may be provided or two or more doping concentration peaks may be provided inside the drift region 18. In the example of FIG. 12C, an example in which one peak is provided inside the drift region 18 is indicated by a broken line. In this example, whether hydrogen ions have passed from the upper surface 21 toward the lower surface 23 can be determined in the same manner as in FIG. 12A.

Figure 12D:
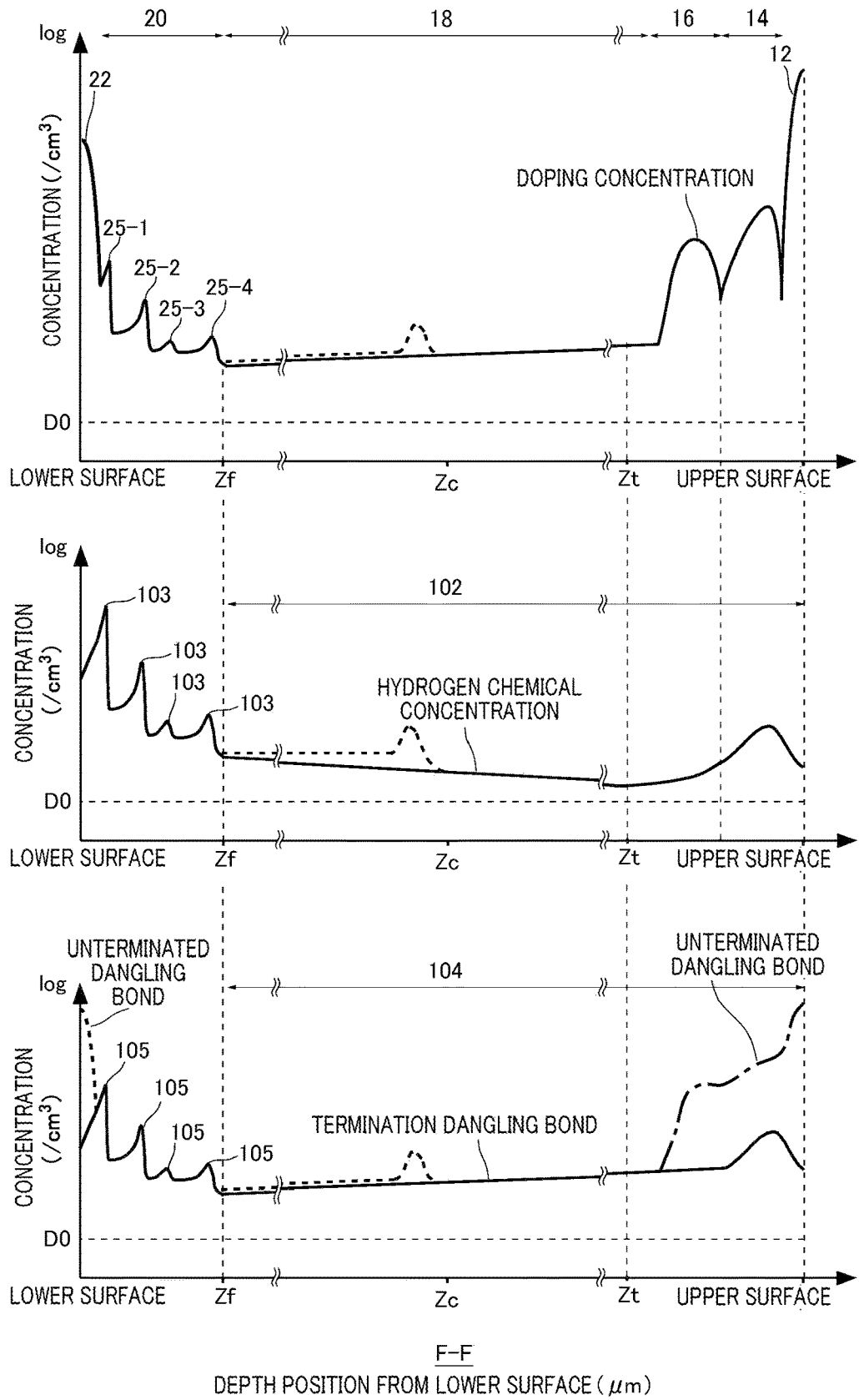
FIG. 12D is a diagram illustrating another example of the doping concentration distribution, the hydrogen chemical concentration distribution, and the termination dangling bond concentration distribution taken along line F-F in FIG. 11.

FIG. 12D is a diagram illustrating another example of the doping concentration distribution, the hydrogen chemical concentration distribution, and the termination dangling bond concentration distribution taken along line F-F in FIG. 11. This example is different from the example of FIG. 12B in that hydrogen ions implanted from the lower surface 23 do not pass through the semiconductor substrate 10 and stop from the accumulation region 16 to the upper surface 21 side. Other structures may be similar to the example of FIG. 12B. In this example, hydrogen ions stop at the depth of the base region 14.

The hydrogen chemical concentration in this example may decrease toward the upper surface 21 in the drift region 18. Further, the hydrogen chemical concentration increases again towards the hydrogen ion stopping region (present in the base region 14 in this example). In addition, the hydrogen chemical concentration may decrease toward the upper surface 21 on the upper surface 21 side from the hydrogen ion stopping region. The hydrogen chemical concentration may have a peak in the base region 14. The concentration distribution of the termination dangling bond may have a peak at substantially the same depth position as the peak of the hydrogen chemical concentration on the upper surface 21 side from the accumulation region 16.

The hydrogen chemical concentration may have a monotonically decreasing section in which the concentration monotonically decreases toward the upper surface 21 between the peak closest to the upper surface 21 of the semiconductor substrate 10 and the end of the base region 14 on the lower surface 23 side. The hydrogen chemical concentration may have an increasing section in which the concentration increases from the end of the base region 14 on the lower surface 23 side to the upper surface 21 of the semiconductor substrate 10 toward the upper surface 21.

In the example of FIG. 12D, whether hydrogen implanted from the lower surface 23 is stopped between the accumulation region 16 or the base region 14 and the upper surface 21 may be determined based on whether the following two characteristics are provided. Characteristic (A'): The hydrogen chemical concentration monotonously decreases between a peak closest to the upper surface 21 among the concentration peaks of the hydrogen chemical concentration and the accumulation region 16 or the base region 14, and the hydrogen chemical concentration has a peak between the accumulation region 16 or the base region 14 and the upper surface 21. Note that a space between the accumulation region 16 and the upper surface 21 includes the accumulation region 16. In addition, a space between the base region 14 and the upper surface 21 includes the base region 14. Characteristic (B): At least the doping concentration of the entire drift region 18 is higher than the bulk donor concentration D0. In other words, there is no position where the donor concentration substantially matches between the bulk donor concentration and the doping concentration over the entire semiconductor substrate 10. When the semiconductor device has both of the above characteristics (A') and (B), it can be regarded that hydrogen implanted from the lower surface 23 is stopped between the accumulation region 16 and the upper surface 21.

Figure 12E:
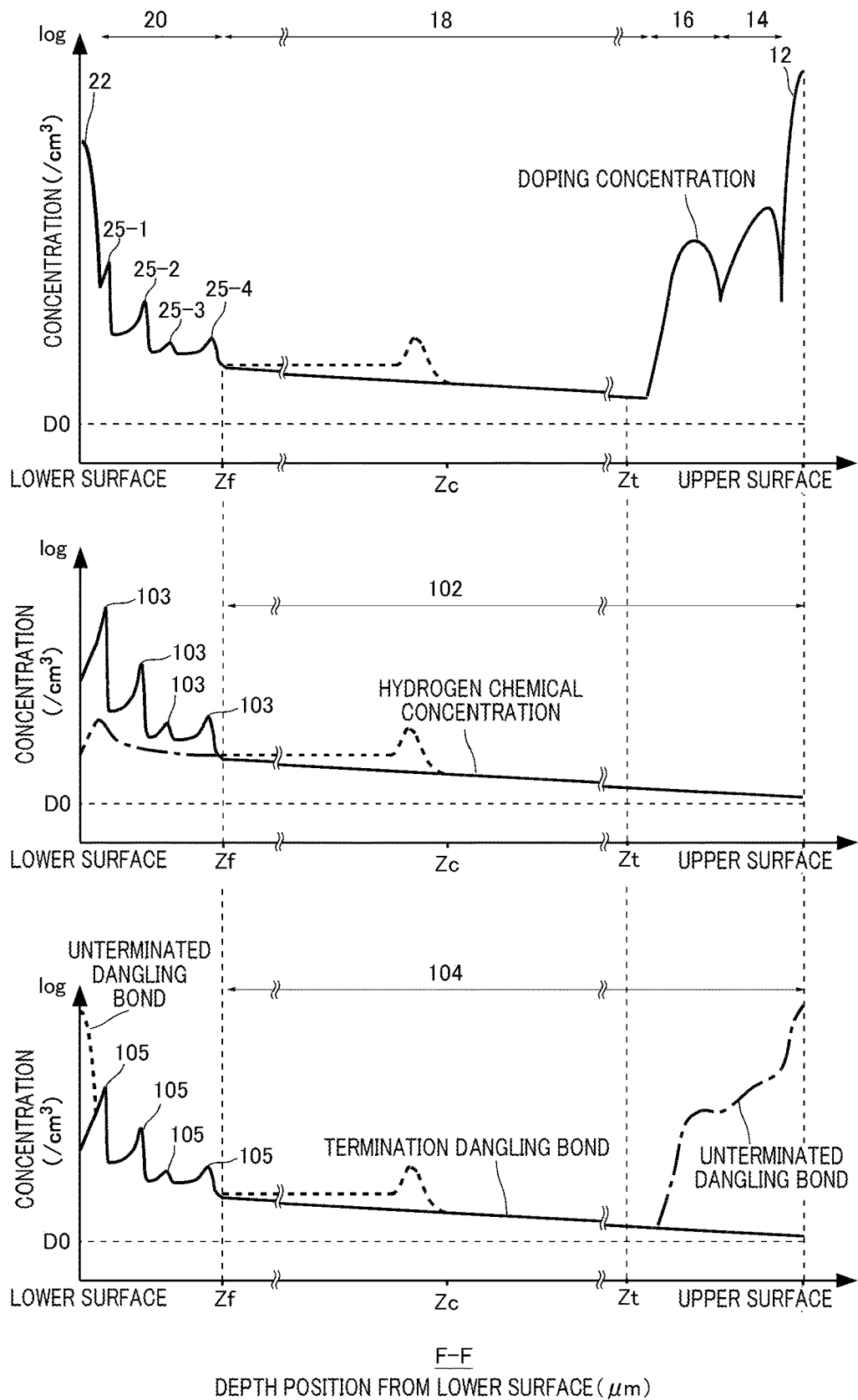
FIG. 12E is a diagram illustrating another example of the doping concentration distribution, the hydrogen chemical concentration distribution, and the termination dangling bond concentration distribution taken along line F-F in FIG. 11.

FIG. 12E is a diagram illustrating another example of the doping concentration distribution, the hydrogen chemical concentration distribution, and the termination dangling bond concentration distribution taken along line F-F in FIG. 11. This example is different from the example of FIG. 12C in that hydrogen ions implanted from the upper surface 21 do not pass through the semiconductor substrate and stop inside the buffer region 20. In this example, hydrogen ions implanted from the upper surface 21 are stopped at the depth of the concentration peak 25-1. In FIG. 12E, the chemical concentration distribution of hydrogen implanted from the upper surface 21 is indicated by a chain line.

The hydrogen chemical concentration in this example has substantially no difference or a sufficiently small difference from the distribution in FIG. 12C. That is, the concentration of hydrogen ions implanted so as to stop inside the buffer region 20 from the upper surface 21 may be equal to or sufficiently smaller than the hydrogen chemical concentration implanted into the buffer region 20 from the lower surface 23. As an example, the peak concentration of hydrogen implanted from the upper surface 21 is about the same as the peak of low concentration (in this example, the concentration peaks 25-3 and 25-4) in the buffer region 20. As a result, at the positions of the high concentration peaks (25-1 and 25-2 in this example) in the buffer region 20, the concentration increase can be made 10% or less with respect to the hydrogen chemical concentration and the doping concentration of the buffer region 20. The low concentration peak refers to N/2 or less peaks counted from the lower concentration peak among the N concentration peaks 25. The high concentration peak refers to N/2 or less peaks counted from the highest concentration among the plurality of concentration peaks 25. In this example, whether hydrogen ions have passed from the upper surface 21 toward the lower surface 23 can be determined in the same manner as in FIG. 12A.

FIG. 13A to FIG. 21 are diagram for explaining an example of a method for determining the bulk donor concentration and a preferred range for the donor concentration. In this example, the bulk donor concentration and the donor concentration in the region are set such that the final donor concentration in the hydrogen concentration flat region or the termination dangling bond flat region 104 becomes a relatively stable concentration even when the bulk donor concentration varies. The hydrogen concentration flat region is a region where the hydrogen chemical concentration distribution of the semiconductor substrate in the depth direction is flat, monotonically increases, or monotonically decreases.

In this example, the specification value of the bulk donor concentration is set to $N_{B0}$, and the actual bulk donor concentration is set to $N_{Bre}$. The specification value of the bulk donor concentration is a specification value defined by a manufacturer of semiconductor wafers. When the specification value has a width, a median value of the specification value may be used. The bulk donor concentration is given by $N=1/q\mu\rho$ with respect to a specific resistance p determined by the concentration of the bulk donor such as phosphorus. q is an elementary electric charge, and $\mu$ is electron mobility in the semiconductor substrate 10.

The concentration of hydrogen donors (VOH defects) is $N_H$. The variation in a hydrogen donor concentration $N_H$ is negligibly small compared to the variation in the bulk donor concentration. In this example, the variation in the hydrogen donor concentration $N_H$ is set to 0.

The target value of the final donor concentration is defined as $N_{F0}$. The final donor concentration actually obtained is defined as $N_{Fre}$. The concentrations described above are all concentrations (/cm$^3$) per unit volume.

The target value $N_{F0}$ of the final donor concentration is obtained by adding the hydrogen donor concentration $N_H$ to the specification value $N_{B0}$ of the bulk donor concentration, and thus is given by the following Expression.

$$N_{F0}=N_H+N_{B0} \quad \text{Expression (1)}$$

On the other hand, the actual donor concentration $N_{Fre}$ is obtained by adding the hydrogen donor concentration $N_H$ to the actual bulk donor concentration $N_{Bre}$, and thus is given by the following Expression.

$$N_{Fre} = N_H + N_{Bre} \quad \text{Expression (2)}$$

The parameter $\beta$ is defined by the following Expression.

$$\beta=N_{Bre}/N_{B0} \quad \text{Expression (3)}$$

The parameter $\beta$ is a ratio between the actual bulk donor concentration $N_{Bre}$ and the specification value $N_{B0}$, and the bulk donor concentration $N_{Bre}$ deviates from the specification value $N_{B0}$ as the parameter is far from 1.

The parameter $\gamma$ is defined by the following Expression.

$$\gamma=N_{Fre}/N_{F0} \quad \text{Expression (4)}$$

The parameter $\gamma$ is a ratio between the actual donor concentration $N_{Fre}$ and the target value $N_{F0}$, and the actual donor concentration $N_{Fre}$ deviates from the target value $N_{F0}$ as the parameter is far from 1. That is, when $\gamma$ is sufficiently close to 1, even when the actual bulk donor concentration $N_{Bre}$ deviates by 6 times from the specification value $N_{B0}$, the actual donor concentration $N_{Fre}$ substantially matches the target value $N_{F0}$ almost independently of $\beta$. Since the parameter $\gamma$ is a ratio of the actual donor concentration $N_{Fre}$ to the target value $N_{F0}$ of the donor concentration, satisfying $0<\gamma$.

The variation in the withstand voltage of the semiconductor device 100 is affected by the parameter $\gamma$ which is the variation in the actual donor concentration $N_{Fre}$. Here, the specific resistance variation of a silicon wafer manufactured by the FZ method in which the variation in the bulk donor concentration is relatively small is generally as follows.

Neutron-irradiated FZ wafer ... ±8% (ratio 0.92 to 1.08)
Gas-doped FZ wafer ... ±12% (ratio 0.88 to 1.12)

The magnitude of the variation in the specific resistance depends on the magnitude of the variation in the donor concentration $N_{Fre}$. Therefore, when $\gamma$ is from 0.85 1.15, the variation in the final donor concentration $N_{Fre}$ is substantially the same as the bulk donor concentration of the silicon wafer of the FZ method described above. In the present specification, the allowable value of $\gamma$ is from 0.85 to 1.15. When the parameter $\gamma$ falls within the range, it may be determined that the donor concentration $N_{Fre}$ is not affected by the parameter $\beta$.

The actual donor concentration $N_{Fre}$ is affected by the variation ($\beta$) in the actual bulk donor concentration $N_{Bre}$. On the other hand, the variation in the hydrogen donor concentration $N_H$ can be regarded as almost 0 as compared with the variation in the bulk donor concentration $N_{Bre}$. Therefore, by reducing the specification value $N_{B0}$ of the bulk donor concentration with respect to the target value $N_{F0}$ of the donor concentration, it is possible to reduce the ratio of components that vary in the donor concentration $N_{Fre}$. Next, it is examined how much the specification value $N_{B0}$ of the bulk donor concentration is made smaller than the target value $N_{F0}$ of the final donor concentration so that the actual donor concentration $N_{Fre}$ can be made sufficiently close to the target value $N_{F0}$ regardless of the parameter β. That is, the specification value $N_{B0}$ of the bulk donor concentration capable of setting the parameter γ to the above-described range from 0.85 to 1.15, preferably a value sufficiently close to 1, is examined.

A parameter ε' is defined by the following Expression.

$$ε'=N_{B0}/N_{F0}$$

Expression (5) is obtained by modifying the above Expression.

$$N_{B0}=ε'\times N_{F0} \quad \text{Expression (5)}$$

Note that ε' is a ratio of the specification value $N_{B0}$ of the bulk donor concentration to the target value $N_{F0}$ of the donor concentration, satisfying 0<ε'. In addition, since $N_{B0}$ is smaller than $N_{F0}$, satisfying ε'<1. That is, 0<ε'<1.

In addition, it is assumed that the hydrogen donor concentration $N_H$ and the specification value $N_{B0}$ of the bulk donor concentration satisfy a relationship of $N_H > N_{B0}$. In the case of $N_H < N_{B0}$, the influence of the specification value $N_{B0}$ of the bulk donor concentration on the final donor concentration $N_{Fre}$ becomes large, the case of $N_H > N_{B0}$ will be considered.

Note that the parameter ε' is a parameter that means to set the specification value $N_{B0}$ of the bulk donor concentration by ε' relative to the target value $N_{F0}$ of the donor concentration.

It is examined whether γ approaches sufficiently 1 regardless of β when ε' is set to a value smaller than 1 within a range not to be 0.

The parameter ε is defined by the following Expression.

$$ε=1/ε' \quad \text{Expression (6)}$$

The following Expression is obtained from Expression (5) and Expression (6).

$$N_{B0}=N_{F0}/ε \quad \text{Expression (7)}$$

The following Expression is obtained by substituting Expression (7) into Expression (1).

$$N_{F0} = N_H + N_{F0}/ε, \text{ i.e., } N_H = (1-1/ε)N_{F0} \quad \text{Expression (8)}$$

The following Expression is obtained by substituting Expression (8) and Expression (3) into Expression (2).

$$N_{Fre}=(1-1/ε)N_{F0}+βN_{B0} \quad \text{Expression (9)}$$

The following Expression is obtained by substituting Expression (7) into Expression (9).

$$N_{Fre} = (1-1/ε)N_{F0} + (β/ε)N_{F0} \quad \text{Expression (10)}$$
$$= (1-1/ε+β/ε)N_{F0}$$

The following Expression is obtained by substituting Expression (10) into Expression (4).

$$γ = 1 - 1/ε + β/ε \quad \text{Expression (11)}$$
$$= 1 + (β-1)/ε$$

The following Expression is obtained from Expression (6) and Expression (11).

$$γ=1+ε'(β-1) \quad \text{Expression (12)}$$

Figure 13A:
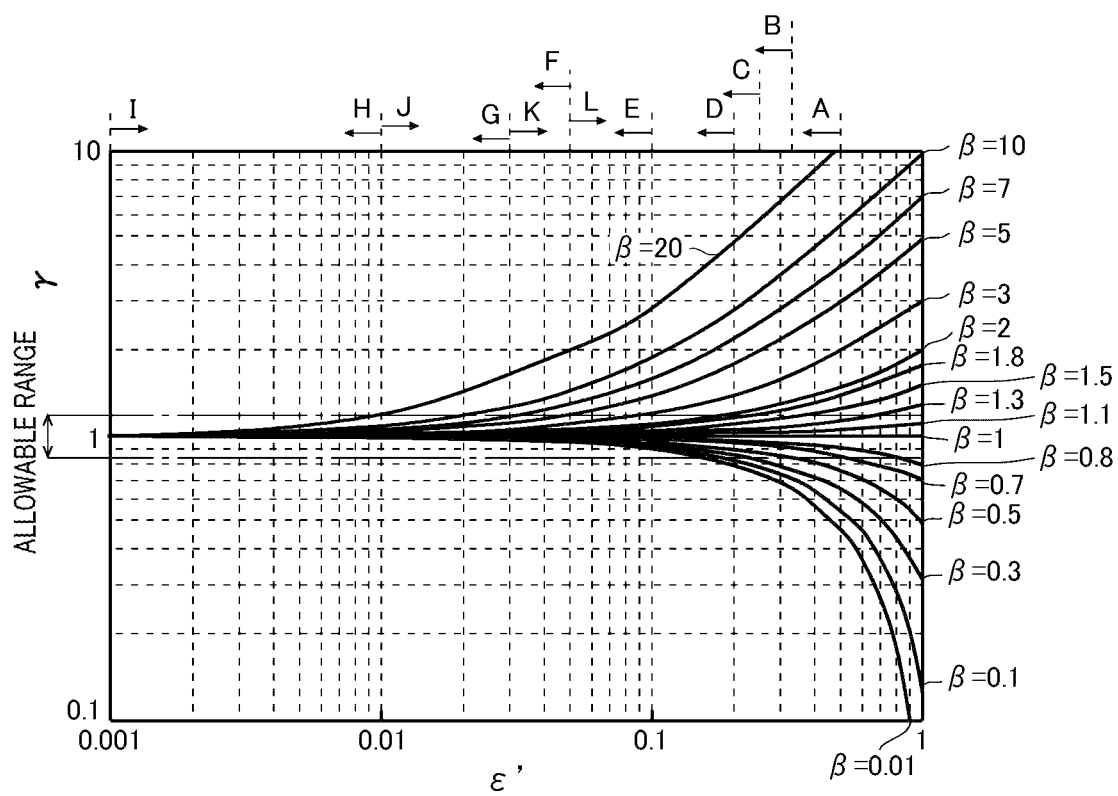
FIG. 13A is a graph illustrating a relationship between $\varepsilon'$ and $\gamma$ for each $\beta$.

FIG. 13A is a graph illustrating a relationship between ε' and γ expressed by Expression (12) for each β. As described above, γ represents the ratio of the actual donor concentration $N_{Fre}$ to the target value $N_{F0}$, and β represents the ratio of the actual bulk donor concentration $N_{Bre}$ to the specification value $N_{B0}$. An allowable value of γ ranges from 0.85 to 1.15.

For example, the specification value $N_{B0}$ of the bulk donor concentration is 0.5 times or less of the target value $N_{F0}$ of the donor concentration, that is, ε' is 0.5 or less. In this case, for example, even when β is 1.3, γ is 1.15 or less and falls within the allowable range. That is, even when the actual bulk donor concentration $N_{Bre}$ is 30% higher than the specification value $N_{B0}$, the actual donor concentration $N_{Fre}$ is 1.15 times or less of the target value $N_{F0}$. In addition, even when β is 0.7, if ε' is 0.5 or less, γ is within an allowable range. As ε' approaches 0, γ converges to 1. For example, in the case of β=2, if ε' is approximately 0.2 or less, γ is within an allowable range.

In order to make γ within the above-mentioned allowable range, for example, the following ranges A to D are conceivable as preferable ranges of ε'.

(Range A)

ε' is 0.5 or less. In a case where ε' is 0.5, when β is within a range of 0.7 to 1.3, γ is within an allowable range (for example, 0.85≤γ≤1.15.{j}. Other examples are similar) For example, when the specification value $N_{B0}$ of the bulk donor concentration is $1\times10^{14}/cm^3$ and ε' is 0.001, the target value $N_{F0}$ of the donor concentration is $1\times10^{11}/cm^3$, corresponding to about 46000 Ωcm.

(Range B)

ε' is 0.333 or less. In a case where ε' is 0.333, if β is within a range of 0.5 to 1.5, γ is within an allowable range. β may be 1.4 or less. For example, when the specification value $N_{B0}$ of the bulk donor concentration is $1\times10^{14}/cm^3$ and ε' is 0.01, the target value $N_{F0}$ of the donor concentration is $1\times10^{12}/cm^3$, corresponding to about 4600 Ωcm.

(Range C)

ε' is 0.25 or less. In a case where ε' is 0.25, if β is within a range of approximately 0.3 to 1.6, γ is within an allowable range. β may be 0.4 or more. For example, when the specification value $N_{B0}$ of the bulk donor concentration is $1\times10^{14}/cm^3$ and ε' is 0.03, the target value $N_{F0}$ of the donor concentration is $3\times10^{12}/cm^3$, corresponding to about 1500 Ωcm.

(Range D)

ε' is 0.2 or less. In a case where ε' is 0.2, if β is within a range of approximately 0.1 to 1.8, γ is within an allowable range. β may be 0.2 or more. For example, when the specification value $N_{B0}$ of the bulk donor concentration is $1\times10^{14}/cm^3$ and ε' is 0.1, the target value $N_{F0}$ of the donor concentration is $1\times10^{13}/cm^3$, corresponding to about 460 Ωcm.

Note that, since the less variation in specific resistance is suitable for practical use, ε' is preferably 0.1 or less, and more preferably 0.02 or less. In this case, for example, the following Ranges E to H are conceivable.

(Range E)

$\varepsilon'$ is 0.1 or less. In a case where $\varepsilon'$ is 0.1, if $\beta$ is within a range of about 0.05 (not illustrated) to 3.0, $\gamma$ is within a sufficiently allowable range. That is, when $\beta$ is 3.0 or less, if $\gamma$ is 1.15 or less and $\beta$ is 0.05 or more, $\gamma$ is 0.85 or more. $\beta$ may be 0.1 or more. $\beta$ may be 2.5 or less. For example, when the specification value $N_{B0}$ of the bulk donor concentration is $1\times10^{14}/cm^3$ and $\varepsilon'$ is 0.1, the target value $N_{F0}$ of the donor concentration is $1\times10^{13}/cm^3$, corresponding to about 460 Ωcm.

(Range F)

$\varepsilon'$ is 0.05 or less. In a case where $\varepsilon'$ is 0.05, if $\beta$ is within a range of about 0.01 (not illustrated) to 5.0, $\gamma$ is within a sufficiently allowable range. $\beta$ may be 0.1 or more. $\beta$ may be 4 or less. For example, when the specification value $N_{B0}$ of the bulk donor concentration is $1\times10^{14}/cm^3$ and $\varepsilon'$ is 0.05, the target value $N_{F0}$ of the donor concentration is $5\times10^{12}/cm^3$, corresponding to about 920 Ωcm.

(Range G)

$\varepsilon'$ is 0.03 or less. In a case where $\varepsilon'$ is 0.03, if $\beta$ is within a range from about 0.1 to 6.0, $\gamma$ is within a sufficiently allowable range. In the range G, $\varepsilon'$ may be 0.02 or less. In a case where $\varepsilon'$ is 0.02, if $\beta$ is within a range of about 0.01 (not illustrated) to 10.0, $\gamma$ is within a sufficiently allowable range. For example, when the specification value $N_{B0}$ of the bulk donor concentration is $1\times10^{14}/cm^3$ and $\varepsilon'$ is 0.02, the target value $N_{F0}$ of the donor concentration is $2\times10^{12}/cm^3$, corresponding to about 2300 Ωcm.

(Range H)

$\varepsilon'$ is 0.01 or less. In a case where $\varepsilon'$ is 0.01, if $\beta$ is within a range of about 0.01 (not illustrated) to 20.0 (not illustrated), $\gamma$ is within a sufficiently allowable range. 6 may be 0.1 or more. $\beta$ may be 10.0 or less. In the range H, $\varepsilon'$ may have a width of 0.01±0.002 (20%). For example, when the specification value $N_{B0}$ of the bulk donor concentration is $1\times10^{14}/cm^3$ and $\varepsilon'$ is 0.01, the target value $N_{F0}$ of the donor concentration is $1\times10^{12}/cm^3$, corresponding to about 4600 Ωcm.

In each of the above ranges, the lower limit of $\varepsilon'$ may be "a value greater than 0". This is because $\gamma$ converges to 1 when $\varepsilon'$ approaches 0. The lower limit of $\varepsilon'$ may be any of the following ranges I, J, K, and L. Other ranges may be used as the lower limit of $\varepsilon'$. In FIG. 13, each range is indicated by an arrow.

(Range I)

$\varepsilon'$ is 0.001 or more. For example, when the specification value $N_{B0}$ of the bulk donor concentration is $1\times10^{14}/cm^3$ and $\varepsilon'$ is 0.001, the target value $N_{F0}$ of the donor concentration is $1\times10^{11}/cm^3$, corresponding to about 46000 Ωcm.

(Range J)

$\varepsilon'$ is 0.01 or more. For example, when the specification value $N_{B0}$ of the bulk donor concentration is $1\times10^{14}/cm^3$ and $\varepsilon'$ is 0.01, the target value $N_{F0}$ of the donor concentration is $1\times10^{12}/cm^3$, corresponding to about 4600 Ωcm.

(Range K)

$\varepsilon'$ is 0.03 or more. For example, when the specification value $N_{B0}$ of the bulk donor concentration is $1\times10^{14}/cm^3$ and $\varepsilon'$ is 0.03, the target value $N_{F0}$ of the donor concentration is $3\times10^{12}/cm^3$, corresponding to about 1500 Ωcm.

(Range L)

$\varepsilon'$ is 0.05 or more. For example, when the specification value $N_{B0}$ of the bulk donor concentration is $1\times10^{14}/cm^3$ and $\varepsilon'$ is 0.05, the target value $N_{F0}$ of the donor concentration is $5\times10^{12}/cm^3$, corresponding to about 920 Ωcm.

As described above, the actual donor concentration $N_{Fre}$ corresponds to the donor concentration in the drift region 18. The withstand voltage of the semiconductor device 100 is determined by the donor concentration of the drift region 18. Therefore, a preferable range of the donor concentration $N_{Fre}$ of the drift region 18 is determined by the rated voltage of the semiconductor device 100. Depending on the donor concentration $N_{Fre}$, the range of the bulk donor concentration $N_{Bre}$ that can stabilize the donor concentration $N_{Fre}$ is determined.

Figure 13B:
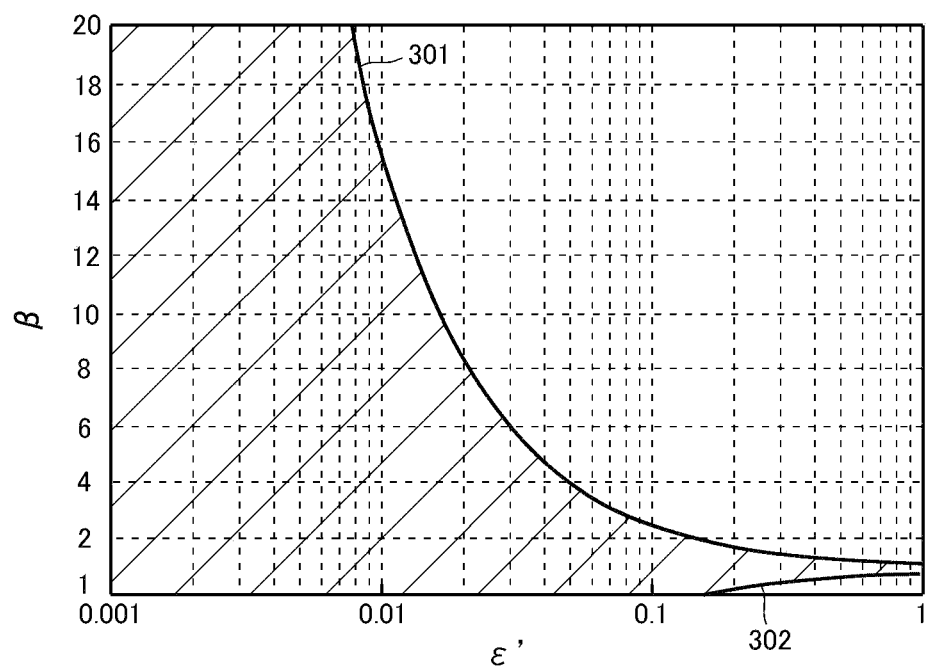
FIG. 13B is a diagram for explaining an example of a preferred range for the parameter $\beta$.

FIG. 13B is a diagram for explaining an example of a preferable range of the parameter $\beta$. As described above, the parameter $\beta$ is the ratio of the actual bulk donor concentration $N_{Bre}$ to the specification value $N_{B0}$. As described in FIG. 13A, the deviation ratio $\gamma$ of the actual donor concentration $N_{Fre}$ to the target value $N_{F0}$ of the final donor concentration is set to be within the predetermined allowable range $\gamma_0$. In the example of FIG. 13A, the allowable range $\gamma_0$ is ±0.15 (that is, from −15% to 15%). The upper limit value and the lower limit value of the deviation ratio $\gamma$ are 1.15 and 0.85, respectively.

By setting the ratio $\beta$ of an error of the actual value $N_{Bre}$ to the specification value $N_{B0}$ of the bulk donor concentration to a predetermined allowable range, the deviation ratio $\gamma$ can be suppressed within the allowable range $\gamma_0$ with respect to a relatively wide range $\varepsilon'$. In order to set the allowable range of the parameter $\beta$, Expression (12) is deformed using the deviation ratios $\gamma$ and $\varepsilon'$ to be Expression (13A).

$$\beta = (\gamma_0 - 1)/\varepsilon' + 1 \qquad \text{Expression (13A)}$$

That is, the range of $\beta$ is expressed by the following Expression.

$$-\gamma_0/\varepsilon' + 1 \leq \beta \leq \gamma_0/\varepsilon' + 1$$

In this example, since $\gamma_0$ is ±15%, the following Expression is obtained in each of the upper limit value 1.15 and the lower limit value 0.85 of $\gamma$.

$$\beta = 0.15/\varepsilon' + 1 (\gamma_{0+} = 1.15) \qquad \text{Expression (13C)}$$

$$\beta = -0.15/\varepsilon' + 1 (\gamma_{0-} = 0.85) \qquad \text{Expression (13D)}$$

From Expressions (13C) and (13D), the range $\beta$ that should be taken with respect to $\varepsilon'$ is the range indicated by hatching in FIG. 13B. In FIG. 13B, a curve 301 corresponds to Expression (13C), and a curve 302 corresponds to Expression (13D). That is, the allowable range of 6 is a range of Expression (13C) or less (that is, the curve 301 or less) and a range of Expression (13D) or more (that is, the curve 302 or more) in a case where $\varepsilon'$ is 1 or less. In FIG. 13B, the range in which $\varepsilon'$ is less than 0.001 and the range in which 6 is greater than 20 are omitted, but even in these ranges, the region between the curve 301 and the curve 302 is the allowable range of 6. The allowable range of $\gamma_0$ may be ±10%, ±7%, ±5%, or ±3%. On the other hand, when the variation in the withstand voltage of the semiconductor device 100 is more allowable, the allowable range of $\gamma_0$ may be ±30% or ±20%.

From the manufactured semiconductor device 100, the actual bulk donor concentration $N_{Bre}$ and the actual donor concentration $N_{Fre}$ can be measured. As the bulk donor concentration $N_{Bre}$, a concentration of donor species (for example, phosphorus) distributed over the entire semiconductor substrate 10 at the central position of the semiconductor substrate 10 in the depth direction may be used. As the donor concentration $N_{Fre}$, a donor concentration at the central position of the semiconductor substrate 10 in the depth direction may be used.

In the semiconductor device 100, it may be assumed that β=1 (that is, the difference between the specification value $N_{B0}$ of the bulk donor concentration and the actual bulk donor concentration $N_{Bre}$ is 0), and $N_{Bre}=N_{B0}$. Assuming that γ=1 (that is, the difference between the target value $N_{F0}$ of the donor concentration and the actual donor concentration $N_{Fre}$ is 0), $N_{F0}=N_{Fre}$ may be set. As a result, ε' can be calculated from Expression (5) using $N_{Bre}$ and $N_{Fre}$. When ε'=$N_{Bre}/N_{Bre}$ is 0.5 or less, it may be determined that the influence of the variation in the bulk donor concentration can be sufficiently reduced to reduce the variation in the donor concentration $N_{Fre}$. ε'=$N_{Bre}/N_{Fre}$ may be any of the ranges indicated in Range A to Range L.

In addition, if the target value $N_{F0}$ of the donor concentration and the specification value $N_{B0}$ of the bulk donor concentration can be discriminated from the production conditions and the like, the parameters 6 and γ can be calculated from Expressions (3) and (4). As a result, a more accurate parameter ε' can be calculated.

The hydrogen donor concentration $N_H$ is represented by the following Expression by the Expressions (1) to (3).

$$N_H=(1-\varepsilon')N_{F0}$$

That is, by setting ε' sufficiently smaller than 1 (for example, 0.1 or less), the hydrogen donor concentration $N_H$ becomes approximately the same value as the target value $N_{F0}$ of the donor concentration. Therefore, the dosage of hydrogen or the like may be set such that the hydrogen donor concentration $N_H$ becomes approximately the same value as the target value $N_{F0}$ of the donor concentration. Similarly, the hydrogen donor concentration $N_H$ is expressed by the following Expression with respect to the specification value $N_{B0}$ of the bulk donor concentration.

$$N_H=(1/\varepsilon'-1)N_{B0}$$

Figure 14:
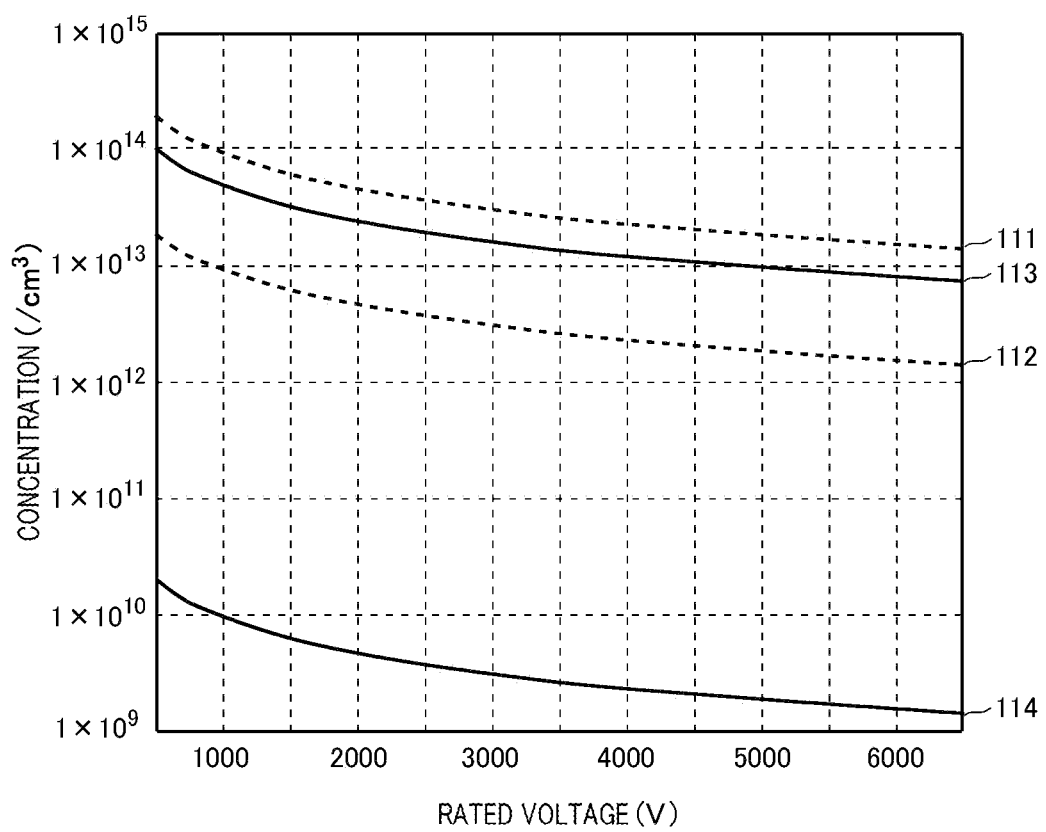
FIG. 14 is a diagram illustrating an example of a preferred range for a bulk donor concentration $N_{Bre}$.

FIG. 14 is a diagram illustrating an example of a preferred range for the bulk donor concentration $N_{Bre}$. In this example, the donor concentration $N_{Fre}$ (/cm$^3$) at the center Zc of the semiconductor substrate 10 in the depth direction is from $(9.20245\times10^{15})/x$ to $(9.20245\times10^{16})/x$. Here, x is the rated voltage (V). The donor concentration $N_{Fre}$ (/cm$^3$) is determined with reference to the doping concentration of the drift region in the general semiconductor substrate formed by the FZ method, but may be determined with reference to the doping concentration of the drift region of the semiconductor substrate formed by the MCZ method. In FIG. 14, an upper limit 111 and a lower limit 112 of the preferable range of the donor concentration $N_{Fre}$ (/cm$^3$) are indicated by broken lines.

In FIG. 14, the upper limit 113 and the lower limit 114 of the preferable range of the bulk donor concentration $N_{Bre}$ in the case of the above-described Range A and Range I (ε' is from 0.001 to 0.5) are indicated by solid lines. The upper limit 113 of the bulk donor concentration $N_{Bre}$ is a value obtained by multiplying the upper limit 111 of the donor concentration $N_{Fre}$ (/cm$^3$) by the upper limit value (0.5) of ε'. The lower limit 114 of the bulk donor concentration $N_{Bre}$ is a value obtained by multiplying the lower limit 112 of the donor concentration $N_{Fre}$ (/cm$^3$) by the lower limit value (0.001) of ε'. The upper limit 113 and lower limit 114 of the bulk donor concentration $N_{Bre}$ are as follows. The unit of the upper limit 113 and the lower limit 114 in each example is (/cm$^3$). As described above, x is the rated voltage (V).

Figure 15:
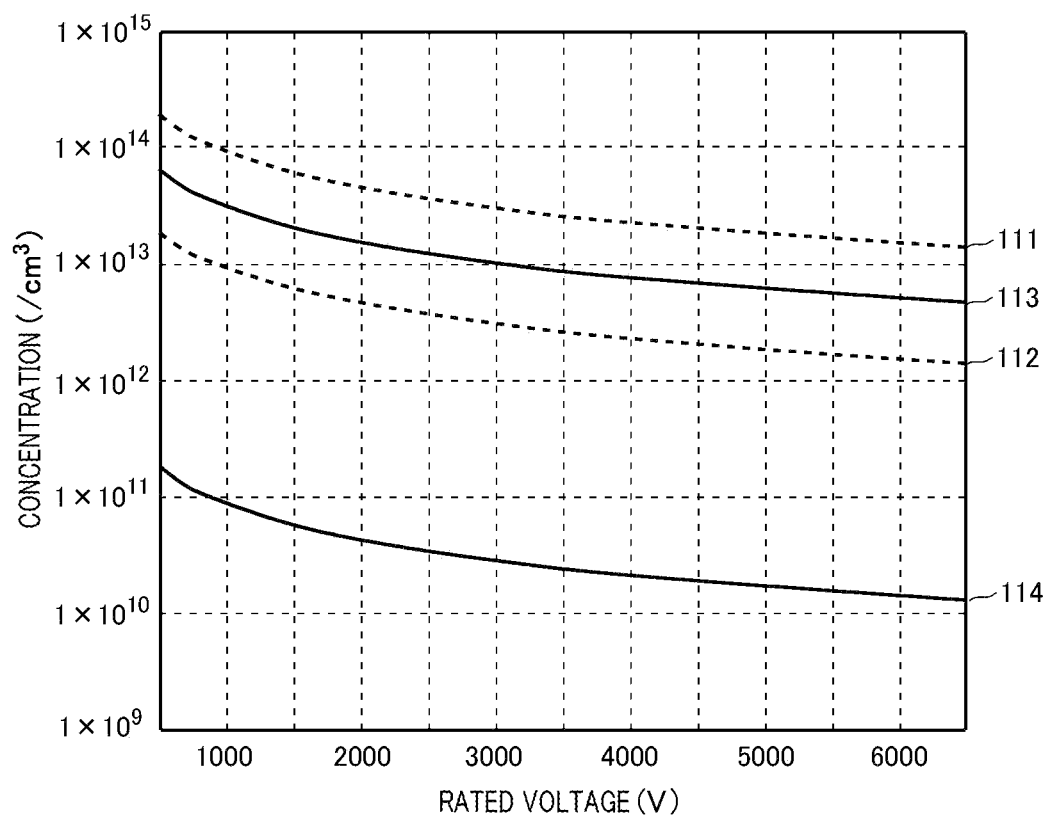
FIG. 15 is a diagram illustrating an example of a preferred range for the bulk donor concentration $N_{Bre}$ when $\varepsilon'$ is in a range B (from 0.01 to 0.333).

Lower limit 114: $(9.20245\times10^{12})/x$
Upper limit 113: $(4.60123\times10^{16})/x$ FIG. 15 is a diagram illustrating an example of a preferred range for the bulk donor concentration $N_{Bre}$ when ε' is in Range B and Range J (from 0.01 to 0.333). The upper limit 111 and the lower limit 112 of the donor concentration $N_{Fre}$ (/cm$^3$) are the same as those in the example of FIG. 14. The upper limit 113 of the bulk donor concentration $N_{Bre}$ is a value obtained by multiplying the upper limit 111 of the donor concentration $N_{Fre}$ (/cm$^3$) by the upper limit value (0.333) of ε'. The lower limit 114 of the bulk donor concentration $N_{Bre}$ is a value obtained by multiplying the lower limit 112 of the donor concentration $N_{Fre}$ (/cm$^3$) by the lower limit value (0.01) of ε'. The upper limit 113 and lower limit 114 of the bulk donor concentration $N_{Bre}$ are as follows.

Figure 16:
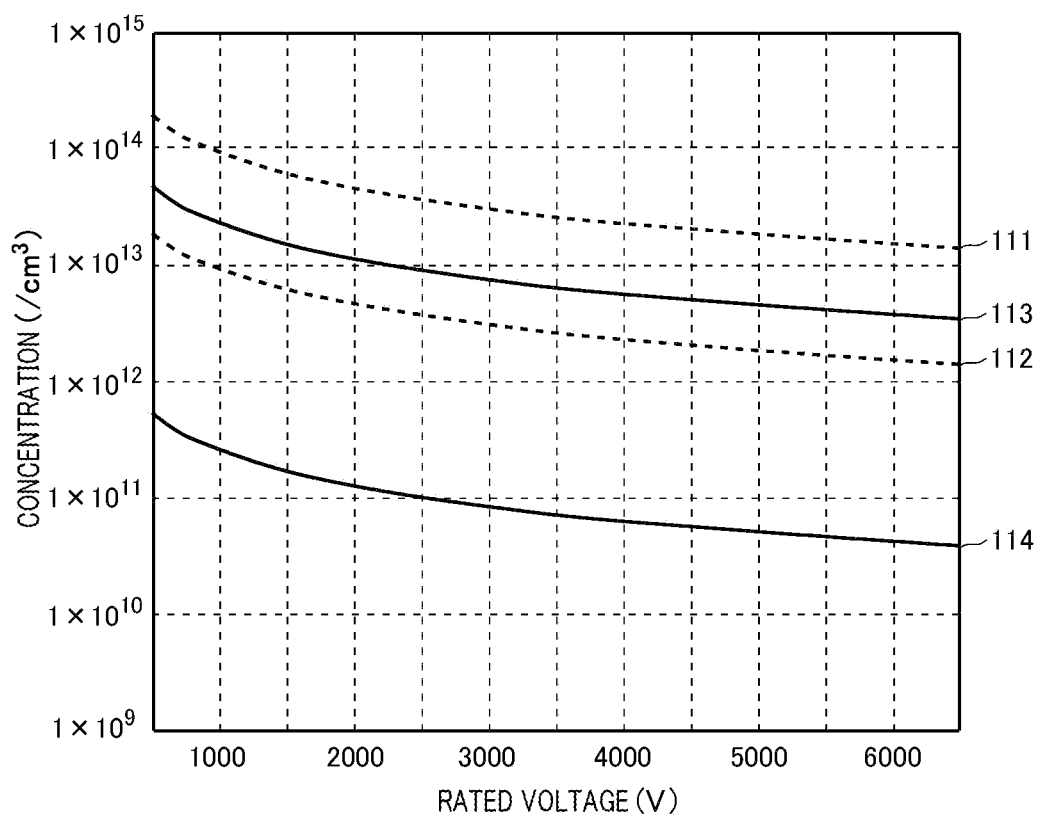
FIG. 16 is a diagram illustrating an example of a preferred range for the bulk donor concentration $N_{Bre}$ when $\varepsilon'$ is in a range C (from 0.03 to 0.25).

Lower limit 114: $(9.20245\times10^{13})/x$
Upper limit 113: $(3.06442\times10^{16})/x$ FIG. 16 is a diagram illustrating an example of a preferred range for the bulk donor concentration $N_{Bre}$ when ε' is in Range C and Range K (from 0.03 to 0.25). The upper limit 111 and the lower limit 112 of the donor concentration $N_{Fre}$ (/cm$^3$) are the same as those in the example of FIG. 14. The upper limit 113 of the bulk donor concentration $N_{Bre}$ is a value obtained by multiplying the upper limit 111 of the donor concentration $N_{Fre}$ (/cm$^3$) by the upper limit value (0.25) of ε'. The lower limit 114 of the bulk donor concentration $N_{Bre}$ is a value obtained by multiplying the lower limit 112 of the donor concentration $N_{Fre}$ (/cm$^3$) by the lower limit value (0.03) of ε'. The upper limit 113 and lower limit 114 of the bulk donor concentration $N_{Bre}$ are as follows.

Figure 17:
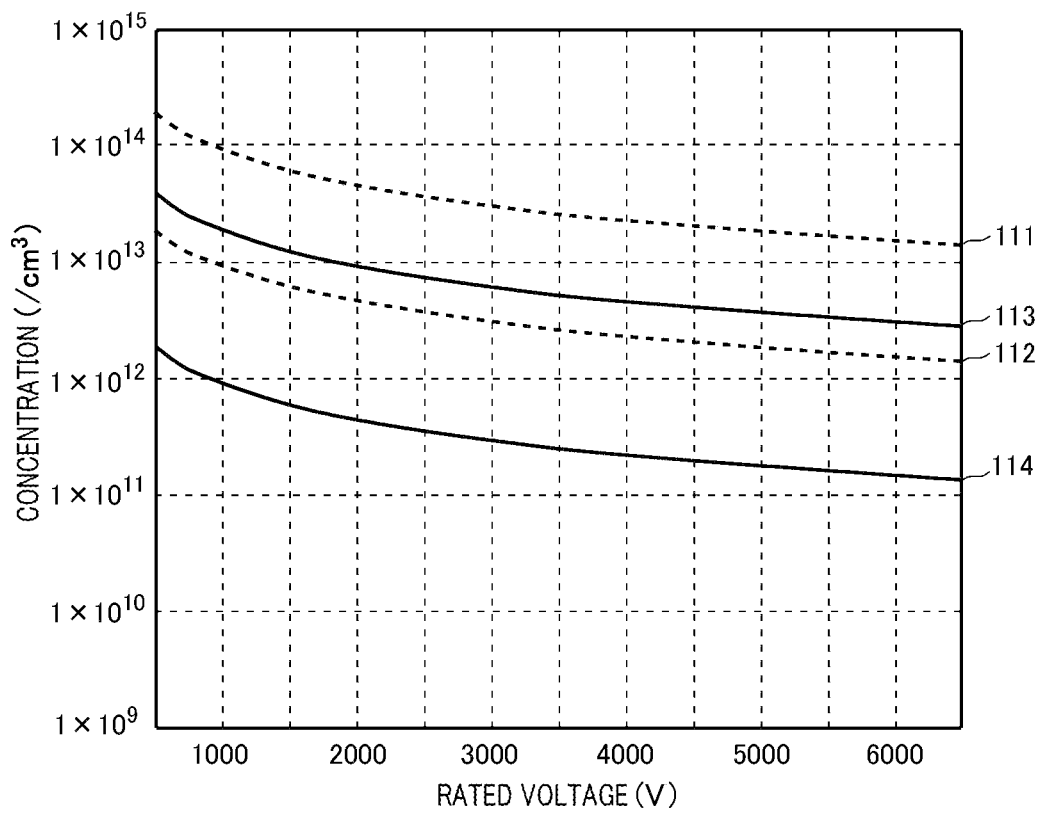
FIG. 17 is a diagram illustrating an example of a preferred range for the bulk donor concentration $N_{Bre}$ when $\varepsilon'$ is in a range D (from 0.1 to 0.2).

Lower limit 114: $(2.76074\times10^{14})/x$
Upper limit 113: $(2.30061\times10^{16})/x$ FIG. 17 is a diagram illustrating an example of a preferred range for the bulk donor concentration $N_{Bre}$ when ε' is in Range D (0.2 or less). The lower limit of ε' in this example is 0.1 or more. The upper limit 111 and the lower limit 112 of the donor concentration $N_{Fre}$ (/cm$^3$) are the same as those in the example of FIG. 14. The upper limit 113 of the bulk donor concentration $N_{Bre}$ is a value obtained by multiplying the upper limit 111 of the donor concentration $N_{Fre}$ (/cm$^3$) by the upper limit value (0.2) of ε'. The lower limit 114 of the bulk donor concentration $N_{Bre}$ is a value obtained by multiplying the lower limit 112 of the donor concentration $N_{Fre}$ (/cm$^3$) by the lower limit value (0.1) of ε'. The upper limit 113 and lower limit 114 of the bulk donor concentration $N_{Bre}$ are as follows.

Figure 18:
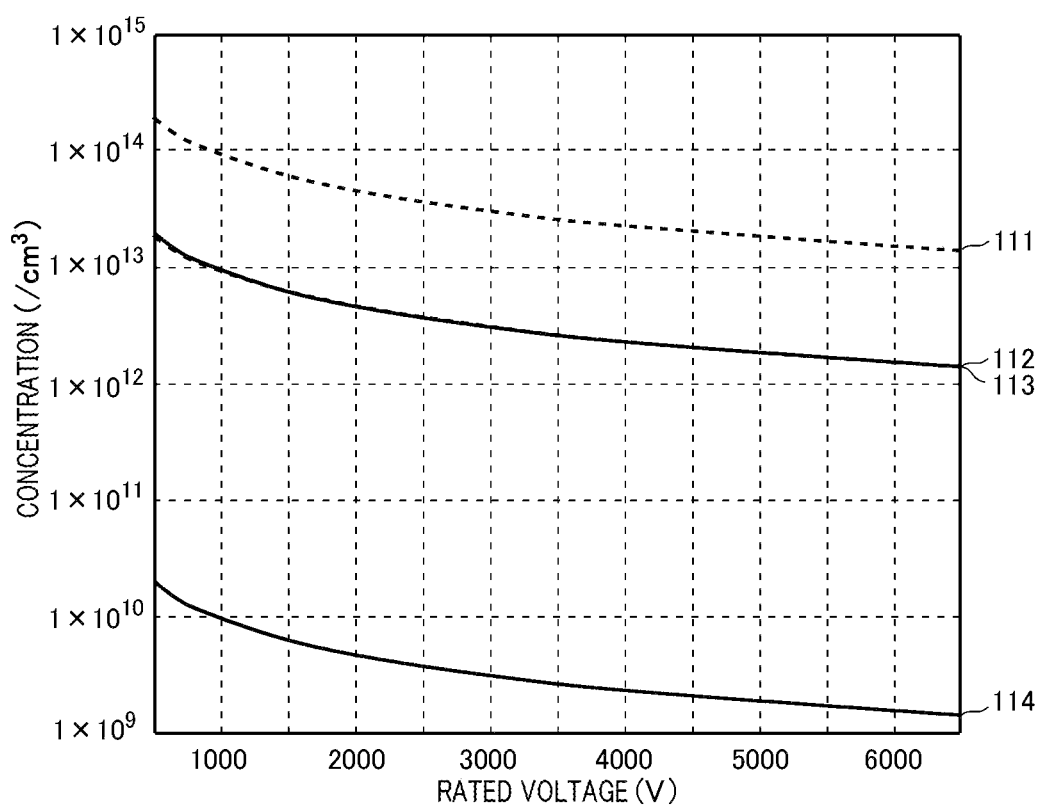
FIG. 18 is a diagram illustrating an example of a preferred range for the bulk donor concentration $N_{Bre}$ when $\varepsilon'$ is in a range E (from 0.001 to 0.1).

Lower limit 114: $(9.20245\times10^{14})/x$
Upper limit 113: $(1.84049\times10^{16})/x$ FIG. 18 is a diagram illustrating an example of a preferred range for the bulk donor concentration $N_{Bre}$ when ε' is in Range E and Range I (from 0.001 to 0.1). The upper limit 111 and the lower limit 112 of the donor concentration $N_{Fre}$ (/cm$^3$) are the same as those in the example of FIG. 14. The upper limit 113 of the bulk donor concentration $N_{Bre}$ is a value obtained by multiplying the upper limit 111 of the donor concentration $N_{Fre}$ (/cm$^3$) by the upper limit value (0.1) of ε'. The lower limit 114 of the bulk donor concentration $N_{Bre}$ is a value obtained by multiplying the lower limit 112 of the donor concentration $N_{Fre}$ (/cm$^3$) by the lower limit value (0.001) of ε'. The upper limit 113 and lower limit 114 of the bulk donor concentration $N_{Bre}$ are as follows.

Figure 19:
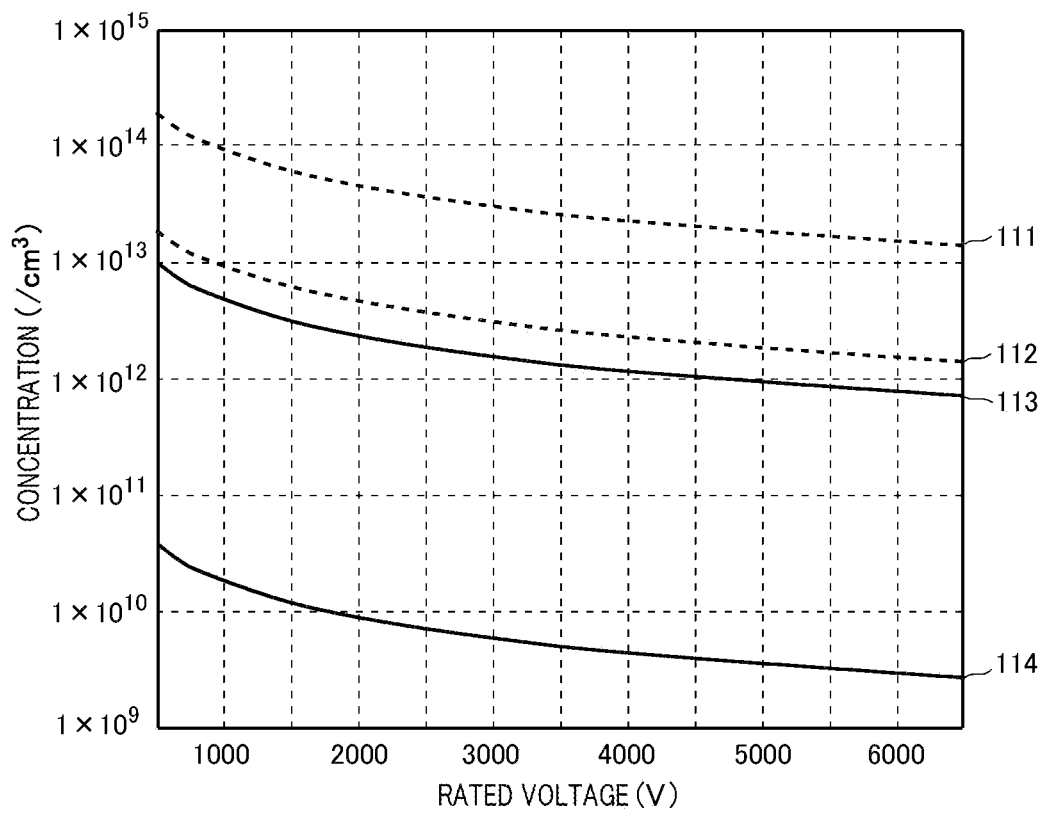
FIG. 19 is a diagram illustrating an example of a preferred range for the bulk donor concentration $N_{Bre}$ when $\varepsilon'$ is in a range F (from 0.002 to 0.05).

Lower limit 114: $(9.20245\times10^{12})/x$
Upper limit 113: $(9.20245\times10^{15})/x$ FIG. 19 is a diagram illustrating an example of a preferred range for the bulk donor concentration $N_{Bre}$ when ε' is in Range F (0.05 or less). The lower limit of ε' is 0.002 or more.

The upper limit 111 and the lower limit 112 of the donor concentration $N_{Fre}$ (/cm³) are the same as those in the example of FIG. 14. The upper limit 113 of the bulk donor concentration $N_{Bre}$ is a value obtained by multiplying the upper limit 111 of the donor concentration $N_{Fre}$ (/cm³) by the upper limit value (0.05) of ε'. The lower limit 114 of the bulk donor concentration $N_{Bre}$ is a value obtained by multiplying the lower limit 112 of the donor concentration $N_{Fre}$ (/cm³) by the lower limit value (0.002) of ε'. The upper limit 113 and lower limit 114 of the bulk donor concentration $N_{Bre}$ are as follows.

Figure 20:
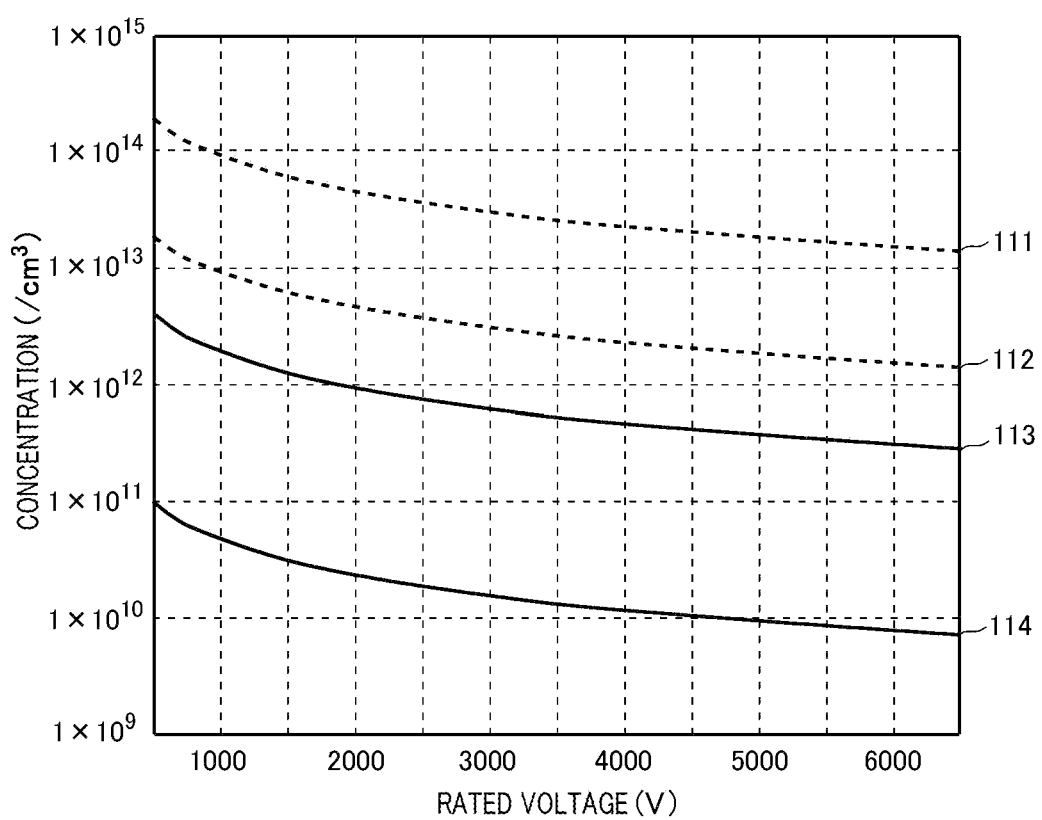
FIG. 20 is a diagram illustrating an example of a preferred range for the bulk donor concentration $N_{Bre}$ when $\varepsilon'$ is in a range G (from 0.05 to 0.02).

Lower limit 114: $(1.84049 \times 10^{13})/x$
Upper limit 113: $(4.60123 \times 10^{15})/x$ FIG. 20 is a diagram illustrating an example of a preferred range for the bulk donor concentration $N_{Bre}$ when ε' is in Range G (0.03 or less). The lower limit of ε' is 0.005 or more. The upper limit 111 and the lower limit 112 of the donor concentration $N_{Fre}$ (/cm³) are the same as those in the example of FIG. 14. The upper limit 113 of the bulk donor concentration $N_{Bre}$ is a value obtained by multiplying the upper limit 111 of the donor concentration $N_{Fre}$ (/cm³) by the upper limit value (0.02) of ε'. The lower limit 114 of the bulk donor concentration $N_{Bre}$ is a value obtained by multiplying the lower limit 112 of the donor concentration $N_{Fre}$ (/cm³) by the lower limit value (0.005) of ε'. The upper limit 113 and lower limit 114 of the bulk donor concentration $N_{Bre}$ are as follows.

Figure 21:
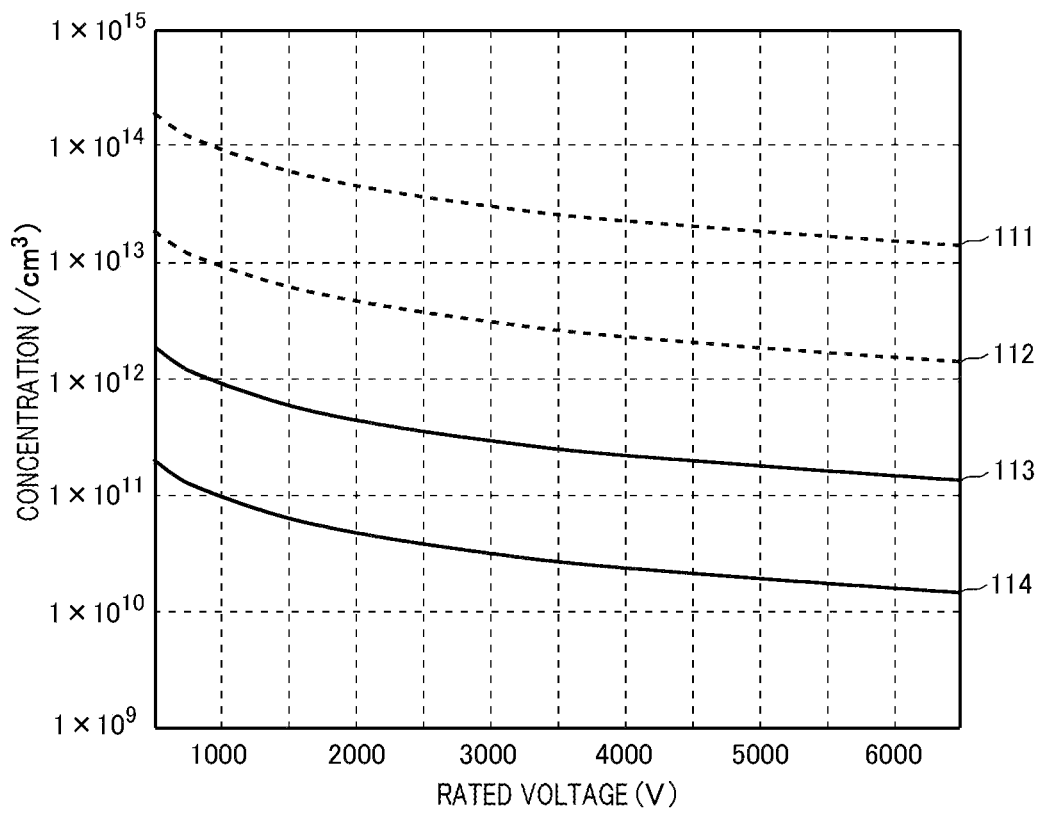
FIG. 21 is a diagram illustrating an example of a preferred range for the bulk donor concentration $N_{Bre}$ when $\varepsilon'$ is in a range H (0.01±0.002).

Lower limit 114: $(4.60123 \times 10^{13})/x$
Upper limit 113: $(1.84049 \times 10^{15})/x$ FIG. 21 is a diagram illustrating an example of a preferred range for the bulk donor concentration $N_{Bre}$ when ε' is in Range H (0.01 or less). The lower limit of ε' is 0.005 or more. The upper limit 111 and the lower limit 112 of the donor concentration $N_{Fre}$ (/cm³) are the same as those in the example of FIG. 14. The upper limit 113 of the bulk donor concentration $N_{Bre}$ is a value obtained by multiplying the upper limit 111 of the donor concentration $N_{Fre}$ (/cm³) by the upper limit value (0.01) of ε'. The lower limit 114 of the bulk donor concentration $N_{Bre}$ is a value obtained by multiplying the lower limit 112 of the donor concentration $N_{Fre}$ (/cm³) by the lower limit value (0.005) of ε'. The upper limit 113 and lower limit 114 of the bulk donor concentration $N_{Bre}$ are as follows.

Lower limit 114: $(9.20245 \times 10^{13})/x$
Upper limit 113: $(9.20245 \times 10^{14})/x$ The upper limit 113 and the lower limit 114 in each range may have a width of ±20%.

As illustrated in FIG. 14 to FIG. 21, when the bulk donor concentration $N_{Bre}$ is set to a concentration between the upper limit 113 and the lower limit 114 in each example, γ indicating the variation in the final donor concentration $N_{Fre}$ can be suppressed within an allowable range. The curve of the lower limit 114 may be smaller than the intrinsic carrier concentration. Here, the intrinsic carrier concentration is $1.45 \times 10^{10}$/cm³ at room temperature (for example, 300 K). When the value of the curve of the lower limit 114 is smaller than the intrinsic carrier concentration, the lower limit 114 may be replaced with the intrinsic carrier concentration.

Figure 22:
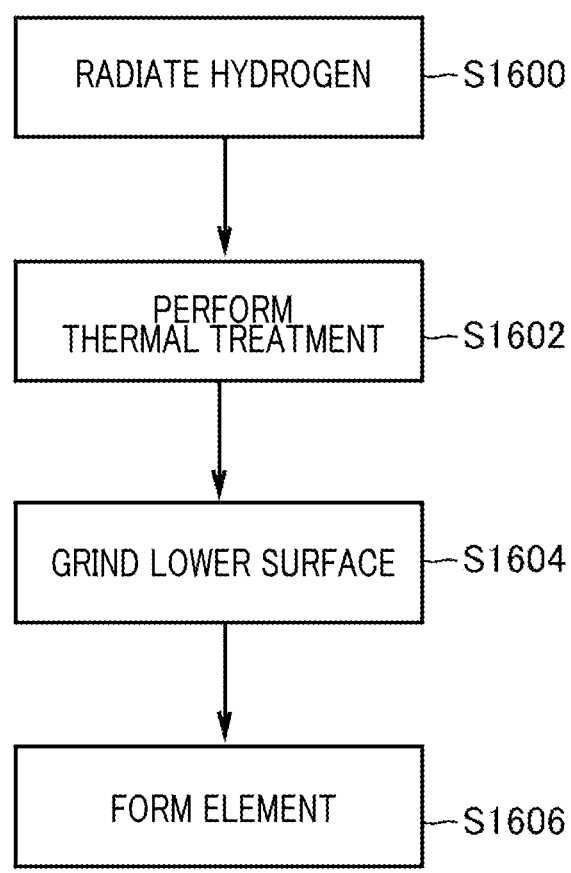
FIG. 22 is a diagram illustrating an example of a manufacturing method of the semiconductor device 100.

FIG. 22 is a diagram illustrating an example of a manufacturing method of the semiconductor device 100. The manufacturing method of this example includes a hydrogen irradiation stage S1600, a heat treatment stage S1602, a lower surface grinding stage S1604, and an element forming stage S1606.

In the hydrogen irradiation stage S1600, the upper surface or the lower surface of the semiconductor substrate is irradiated with hydrogen ions so as to penetrate the semiconductor substrate in the depth direction. The semiconductor substrate may be a semiconductor wafer or a chip divided from the wafer. In S1600, the semiconductor substrate is irradiated with hydrogen ions with acceleration energy that is twice or more the acceleration energy corresponding to the thickness of the semiconductor substrate. This makes it easy to flatten the hydrogen chemical concentration distribution in the semiconductor substrate. The acceleration energy of hydrogen ions may be three times or more, or four times or more of the acceleration energy corresponding to the thickness of the semiconductor substrate.

Next, the semiconductor substrate is subjected to heat treatment in the heat treatment stage S1602. In Stage S1602, the entire semiconductor substrate may be heat-treated by an annealing furnace. As a result, formation of VOH defects is promoted, and the distribution described in FIG. 1B and the like is easily obtained. The heat treatment temperature in Stage S1602 may be from 350° C. to 380° C.

Next, in the lower surface grinding stage S1604, the upper surface or the lower surface of the semiconductor substrate is ground to adjust the thickness of the semiconductor substrate. In S1604, it is preferable to grind the surface implanted with hydrogen ions. As a result, it is possible to grind a region which is greatly damaged by the implantation of hydrogen ions. Next, in the element forming stage S1606, each component described in FIG. 9 to FIG. 11 is formed. Thus, the semiconductor device 100 can be manufactured.

In another example, the hydrogen irradiation stage S1600 and the heat treatment stage S1602 may be performed after the lower surface grinding stage S1604. In addition, the hydrogen irradiation stage S1600 may be performed before the undersurface grinding stage S1604, and the heat treatment stage S1602 may be performed after the lower surface grinding stage S1604.

Although the present invention has been described using the embodiments, the technical scope of the present invention is not limited to the scope described in the above embodiments. It is apparent to those skilled in the art that various modifications or improvements can be made to the above embodiments. It is apparent from the description of the claims that modes to which such changes or improvements are added can also be included in the technical scope of the present invention.

It should be noted that the order of execution of each processing such as operations, procedures, steps, and stages in the devices, systems, programs, and methods illustrated in the claims, the specification, and the drawings can be realized in any order unless "before", "prior to", or the like is specifically stated, and unless the output of the previous processing is used in the later processing. Even if the operation flow in the claims, the specification, and the drawings is described using "First", "Next", and the like for convenience, it does not mean that it is essential to perform in this order.

EXPLANATION OF REFERENCES

10: semiconductor substrate; 11: well region; 12: emitter region; 14: base region; 15: contact region; 16: accumulation region; 18: drift region; 20: buffer region; 21: upper surface 22: collector region; 23: lower surface; 24: collector electrode; 25: concentration peak; 29: linear portion; 30: dummy trench portion 31: edge portion; 32: dummy insulating film; 34: dummy conductive portion; 38: interlayer dielectric film; 39: linear portion; 40: gate trench portion; 41: edge portion; 42: gate insulating film; 44: gate conductive portion; 52: emitter electrode; 54: contact hole; 60, 61: mesa portion; 70: transistor portion; 80: diode portion; 81: extension region; 82: cathode region; 90: edge termination structure portion; 100: semiconductor device; 102: region; 103: concentration peak; 104: termination dangling bond flat region; 105: concentration peak; 111: upper limit; 112: lower limit; 113: upper limit; 114: lower limit; 130: outer circumferential gate runner; 131: active-side gate runner; 160: active portion; 162: edge; 164: gate pad; 200: semiconductor device; 201, 202, 203: concentration peak 210: hydrogen concentration peak; 211, 212: local peak; 214: linear approximation distribution; 216: band-shaped range; 301, 302: curve

What is claimed is:

1. A semiconductor device comprising:
a semiconductor substrate having an upper surface and a lower surface and including a bulk donor, wherein
a hydrogen chemical concentration distribution of the semiconductor substrate in a depth direction is flat, monotonically increasing, or monotonically decreasing from the lower surface to the upper surface except for a portion where a local hydrogen concentration peak is provided, and
a supplemental donor concentration of the semiconductor substrate is higher than a bulk donor concentration distributed throughout the semiconductor substrate from the upper surface to the lower surface.

2. The semiconductor device according to claim 1, wherein
the semiconductor substrate includes a termination dangling bond that is a dangling bond terminated with hydrogen, and
the semiconductor substrate is provided with a termination dangling bond region in which a concentration of the termination dangling bond is flat, monotonically increasing, or monotonically decreasing over a range of 40% or more of a thickness of the semiconductor substrate in the depth direction.

3. The semiconductor device according to claim 2, wherein
the termination dangling bond region is in a range of 60% or less of a thickness of the semiconductor substrate in the depth direction.

4. The semiconductor device according to claim 2, wherein
the termination dangling bond region includes a central position of the semiconductor substrate in the depth direction.

5. The semiconductor device according to claim 1, wherein
the hydrogen chemical concentration is configured to monotonously decrease between a peak closest to the upper surface and the upper surface.

6. The semiconductor device according to claim 5, wherein
a hydrogen chemical concentration in the upper surface is higher than the bulk donor concentration.

7. The semiconductor device according to claim 1, comprising:
a donor concentration region in which the donor concentration is flat, monotonically increasing, or monotonically decreasing between a peak of a hydrogen chemical concentration closest to the upper surface and the upper surface, wherein
an absolute value of a semi-logarithmic slope of the donor concentration region is from 0/cm to 50/cm.

8. The semiconductor device according to claim 3, wherein
the semiconductor substrate includes:
a drift region of a first conductivity type;
a base region of a second conductivity type provided between the drift region and the upper surface; and
a collector region of the second conductivity type provided between the drift region and the lower surface, wherein
at least a part of the drift region is the termination dangling bond region.

9. The semiconductor device according to claim 8, wherein
the hydrogen chemical concentration includes:
a monotonically decreasing section in which the concentration monotonically is configured to decrease from a peak closest to the upper surface to the base region; and
an increasing section in which the concentration is configured to increase between the base region and the upper surface.

10. The semiconductor device according to claim 8, wherein
the semiconductor substrate includes an accumulation region of the first conductivity type having a higher doping concentration than the drift region between the drift region and the base region.

11. The semiconductor device according to claim 8, wherein
the semiconductor substrate includes a buffer region of the first conductivity type having a higher doping concentration than the drift region between the drift region and the collector region.

12. The semiconductor device according to claim 1, wherein
when a rated voltage of the semiconductor device is x (V), the bulk donor concentration (atoms/cm$^3$) is from $(9.20245\times10^{12})/x$ to $(4.60123\times10^{16})/x$.

13. The semiconductor device according to claim 1, wherein
when a rated voltage of the semiconductor device is x (V), the bulk donor concentration (atoms/cm$^3$) is from $(9.20245\times10^{14})/x$ to $(1.84049\times10^{16})/x$.

14. The semiconductor device according to claim 1, wherein
when a rated voltage of the semiconductor device is x (V), a donor concentration (/cm$^3$) at a center of the semiconductor device in the depth direction is from $(9.20245\times10^{15})/x$ to $(9.20245\times10^{16})/x$.

15. The semiconductor device according to claim 1, wherein
in a region where a hydrogen chemical concentration distribution of the semiconductor substrate in a depth direction is flat, monotonically increasing, or monotonically decreasing, a ratio $N_B/N_F$ of a bulk donor concentration $N_B$ to a donor concentration $N_F$ is 0.5 or less.

16. The semiconductor device according to claim 15, wherein
the ratio $N_B/N_F$ is 0.1 or less.

17. The semiconductor device according to claim 1, wherein
in a region where a hydrogen chemical concentration distribution of the semiconductor substrate in a depth direction is flat, monotonically increasing, or monotonically decreasing, a ratio $\beta$ of an actual bulk donor concentration $N_{Bre}$ to a predetermined value $N_{B0}$ of a bulk donor concentration is set as $\beta = N_{Bre}/N_{B0}$, and
a ratio $\gamma$ of an actual donor concentration $N_{Fre}$ to a target value $N_{F0}$ of a final donor concentration is set as $\gamma = N_{Fre}/N_{F0}$, and an predetermined ratio of a variation of $\gamma$ is set as $\gamma_0$, satisfying:

$\varepsilon' = N_{B0}/N_{F0}$, and $-\gamma_0/\varepsilon' + 1 \leq \beta \leq \gamma_0/\varepsilon' + 1$.

18. The semiconductor device according to claim 17, wherein
the predetermined ratio $\gamma_0$ is ±0.15.

19. The semiconductor device according to claim 1, wherein
a hydrogen chemical concentration distribution of the semiconductor substrate in a depth direction is configured to monotonously increase or monotonously decrease from the lower surface to the upper surface except for a portion where a local hydrogen concentration peak is provided.

20. The semiconductor device according to claim 1, wherein
a variation range of a hydrogen chemical concentration distribution from the lower surface to the upper surface of the semiconductor substrate in a depth direction is 30% or less of an average value of hydrogen chemical concentrations in the lower surface and the upper surface except for a portion where a local hydrogen concentration peak is provided.

21. The semiconductor device according to claim 1, wherein
a half-value width of a local hydrogen concentration peak is 1/10 or less of a thickness of the semiconductor substrate.

* * * * *